(12) United States Patent
Bailey et al.

(10) Patent No.: US 9,170,901 B2
(45) Date of Patent: Oct. 27, 2015

(54) SYSTEM AND METHOD FOR ANALYZING AN ELECTRONICS DEVICE INCLUDING A LOGIC ANALYZER

(75) Inventors: James Ray Bailey, Georgetown, KY (US); Christopher W Case, Georgetown, KY (US); James Patrick Sharpe, Lexington, KY (US); James Alan Ward, Mayslick, KY (US); Michael Anthony Marra, III, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 597 days.

(21) Appl. No.: 13/308,286

(22) Filed: Nov. 30, 2011

(65) Prior Publication Data

US 2012/0144256 A1  Jun. 7, 2012

Related U.S. Application Data

(63) Continuation-in-part of application No. 12/983,016, filed on Dec. 31, 2010, which is a continuation-in-part of application No. 12/877,846, filed on Sep. 8, 2010, now Pat. No. 8,516,304, and a continuation-in-part of (Continued)

(51) Int. Cl.
| | |
|---|---|
| *G06F 11/00* | (2006.01) |
| *G06F 11/25* | (2006.01) |
| *G06F 11/26* | (2006.01) |
| *G06F 11/273* | (2006.01) |

(Continued)

(52) U.S. Cl.
CPC ............ *G06F 11/25* (2013.01); *G01R 31/3177* (2013.01); *G06F 11/2294* (2013.01); *G06F 11/26* (2013.01); *G06F 11/273* (2013.01)

(58) Field of Classification Search
CPC . G06F 11/2294; G06F 11/0733; G06F 11/25; G06F 11/26; G06F 11/27; G06F 11/273; G06F 11/30; G06F 11/3041; G06F 11/322; G06F 11/364; G06F 11/3636; G01R 31/3177
USPC ............ 714/25, 27, 30, 33, 37, 39, 46, 57, 48
See application file for complete search history.

(56) References Cited

U.S. PATENT DOCUMENTS

| | | |
|---|---|---|
| 5,881,217 A | 3/1999 | Ranson et al. |
| 5,943,490 A | 8/1999 | Sample |

(Continued)

OTHER PUBLICATIONS

M. Abramovici et al., "A Reconfigurable Design-for-Debug Infrastructure for SoCs," Design Automation Conference 2006, Jul. 24-28, 2006, pp. 7-12.

(Continued)

*Primary Examiner* — Joseph D Manoskey

(57) ABSTRACT

A system for testing or debugging a device under test having an embedded logic analyzer. In one embodiment, the system includes software stored in non-transitory memory for testing a device under test having an embedded logic analyzer, the software program product having instructions which, when executed by a computing device associated with the device under test cause the computing device to reconstruct signals of interest in the device under test based at least in part upon signals captured by the embedded logic analyzer during the test or debug session, and cause the computing device to display the reconstructed signals of interest to a user of the computing device.

20 Claims, 18 Drawing Sheets

Related U.S. Application Data application No. 12/877,819, filed on Sep. 8, 2010, which is a continuation-in-part of application No. 12/542,976, filed on Aug. 18, 2009, now abandoned.

(60) Provisional application No. 61/141,849, filed on Dec. 1, 2010.

(51) Int. Cl.
*G01R 31/3177* (2006.01)
*G06F 11/22* (2006.01)

(56) References Cited

U.S. PATENT DOCUMENTS

| | | | |
|---|---|---|---|
| 5,954,830 A | 9/1999 | Ternullo, Jr. | |
| 6,016,563 A | 1/2000 | Fleisher | |
| 6,212,652 B1 | 4/2001 | Williams | |
| 6,389,558 B1 * | 5/2002 | Herrmann et al. | 714/39 |
| 6,460,148 B2 | 10/2002 | Veenstra et al. | |
| 6,523,136 B1 | 2/2003 | Higashida | |
| 6,564,347 B1 * | 5/2003 | Mates | 714/727 |
| 6,633,838 B1 | 10/2003 | Arimilli et al. | |
| 6,704,889 B2 | 3/2004 | Veenstra et al. | |
| 6,707,474 B1 | 3/2004 | Beck et al. | |
| 6,791,352 B2 | 9/2004 | Verdoorn et al. | |
| 6,850,852 B1 | 2/2005 | Ferguson et al. | |
| 7,240,303 B1 | 7/2007 | Schubert et al. | |
| 7,332,929 B1 | 2/2008 | Normoyle et al. | |
| 7,350,121 B2 * | 3/2008 | Creigh | 714/724 |
| 7,493,247 B2 | 2/2009 | Memmi | |
| 7,506,286 B2 | 3/2009 | Beardslee et al. | |
| 7,650,545 B1 | 1/2010 | Abramovici et al. | |
| 7,650,555 B2 | 1/2010 | Imming et al. | |
| 7,669,096 B2 * | 2/2010 | Agarwal | 714/30 |
| 7,680,142 B1 | 3/2010 | Tvete et al. | |
| 2002/0194543 A1 | 12/2002 | Veenstra et al. | |
| 2003/0078752 A1 | 4/2003 | Allamsetty | |
| 2004/0003332 A1 | 1/2004 | Kim et al. | |
| 2004/0216061 A1 | 10/2004 | Floyd et al. | |
| 2006/0190758 A1 * | 8/2006 | Wickeraad | 713/600 |
| 2007/0226541 A1 | 9/2007 | Brunot et al. | |
| 2008/0092003 A1 | 4/2008 | Khoche et al. | |
| 2008/0191735 A1 | 8/2008 | Redgrave et al. | |
| 2011/0047423 A1 | 2/2011 | Bailey | |
| 2011/0047424 A1 | 2/2011 | Bailey et al. | |
| 2011/0047427 A1 | 2/2011 | Bailey et al. | |
| 2011/0148456 A1 | 6/2011 | Mooyman-Beck et al. | |
| 2011/0167311 A1 | 7/2011 | Bailey et al. | |

OTHER PUBLICATIONS

J. Bailey et al., "Embedded Logic Analyzers for On-Line System Analysis," Proceedings on the International Conference on Information Systems Analysis & Synthesis, 2002.
B. Quinton et al., "Programmable Logic Core Based Post-Silicon Debug for SoCs," slides from the 4th IEEE Silicon Debug and Diagnosis Workshop, May 2007.
B. Quinton et al., "Programmable Logic Core Based Post-Silicon Debug for SoCs," 4th IEEE Silicon Debug and Diagnosis Workshop, May 2007.
International Search Report for counterpart PCT application PCT/US2011/62910, Apr. 6, 2012.
File History for U.S. Appl. No. 12/542,976, filed Sep. 8, 2010.
File History for U.S. Appl. No. 12/877,819, filed Sep. 8, 2010.
File History for U.S. Appl. No. 12/983,016, filed Dec. 31, 2010.
File History for U.S. Appl. No. 12/542,976, filed Aug. 18, 2009.
File History for U.S. Appl. No. 12/877,846, filed Sep. 8, 2010.

* cited by examiner

SYSTEM AND METHOD FOR ANALYZING AN ELECTRONICS DEVICE INCLUDING A LOGIC ANALYZER

CROSS REFERENCE TO RELATED APPLICATIONS

Pursuant to 37 C.F.R. §1.78, this application is a continuation-in-part application and claims the benefit of the earlier filing date of application Ser. No. 12/983,016, filed Dec. 31, 2010, and entitled "A System and Method for Analyzing an Electronics Device Including a Logic Analyzer," which itself is a continuation-in-part application and claims the benefit of the earlier filing date of application Ser. No. 12/877,846, filed Sep. 8, 2010 now U.S. Pat. No. 8,516,304, and entitled "An Integrated Circuit Including a Programmable Logic Analyzer with Enhanced Analyzing and Debugging Capabilities," and application Ser. No. 12/877,819, filed Sep. 8, 2010, and entitled "An Integrated Circuit Including a Programmable Logic Analyzer with Enhanced Analyzing and Debugging Capabilities and a Method thereof," which are continuation-in-part applications of U.S. application Ser. No. 12/542,976, filed Aug. 18, 2009 now abandoned, entitled "An Integrated Circuit Including a Programmable Logic Analyzer with Enhanced Analyzing and Debugging Capabilities and a Method Therefor." This application also claims the benefit of the earlier filing date of U.S. provisional application 61/418, 849, filed Dec. 1, 2010, entitled "A System and Method for Analyzing an Electronics Device Including a Logic Analyzer." The contents of the above-identified patent applications are hereby incorporated by reference herein in their entirety.

BACKGROUND

1. Field of the Invention

The present invention relates generally to an embedded logic analyzer, and particularly to a programmable embedded logic analyzer for analyzing an electronic circuit.

2. Description of the Related Art

A logic analyzer is an electronic instrument that is used to capture and display data signals of an electronic circuit. Generally, the logic analyzer captures the data signals that are too fast to be observed by a user. The user observes the data signals captured by the logic analyzer to effectively analyze the electronic circuit and to take preemptive actions or to debug based on the analysis.

Logic Analyzers may be broadly classified as external logic analyzers and embedded logic analyzers. The embedded logic analyzer is generally included within a programmable logic device or an integrated circuit (IC), e.g., a complex programmable logic device (CPLD), field programmable gate array (FPGA), application specific integrated circuit (ASIC), etc. The embedded logic analyzer has the ability to capture large amounts of high speed data signals within the IC.

The embedded logic analyzer may include a memory to store the captured data signals. Usually, the embedded logic analyzer is programmable to capture and store the data signals specified by the user. The data signals stored by the embedded logic analyzer may be transferred to a computer for further analysis. The data signals are generally transferred to the computer through an interface provided on the IC.

FIG. 1 is a block diagram of a conventional embedded logic analyzer (ELA) 100 included within an integrated circuit (not shown). The ELA 100 includes an interconnect module 110 to receive a plurality of data signals within the integrated circuit. The interconnect module 110 is programmable to select a plurality of signals to be sampled and at least one trigger signal to enable sampling from the plurality of received signals. The at least one trigger signal is transferred to a trigger module 120. The trigger module 120 is programmable to set a trigger condition and to detect if the at least one trigger signal satisfies the trigger condition. If the trigger condition is satisfied, the trigger module 120 initiates a sampling process. Upon the initiation of the sampling process, a memory controller 130 starts sampling the plurality of signals to be sampled from the interconnect module 110. The sampled signals may be stored in a memory 140 for further analysis. Therefore, the ELA 100 operates to execute a general code given below:

IF (<TRIGGER CONDITION>) THEN (SAMPLE SIGNALS(X)), wherein the TRIGGER CONDITION is any logical operation or a series of logical operations and the SIGNALS (X) are the plurality of signals to be sampled from the interconnect module 110. According to the code executed by the ELA 100, when the trigger condition is satisfied, the ELA 100 samples at least one sampled signal and stores the sampled signal in the memory 140. Once signals are captured by the logic analyzer, they may be provided to a test system for analysis.

In order to provide useful insight into a system, an ELA, such as ELA 100, desirably has a lot of information available to it for capture. This means that ELA 100 typically has many signals connected to it inside of the IC in which ELA 100 is located. The circuitry of interconnect module 110 can grow exponentially in size as the number of inputs thereto increases. The majority of the gates that make up the circuitry of ELA 100 may be made up of interconnect module 110. In addition, the routing congestion from having a large number of signals routed to ELA 100 alone can make the IC containing ELA 100 either unroutable or cause the size and therefore manufacturing cost of the IC to undesirably substantially increase. The size requirements for getting the desired amount of information to ELA 100 for selection thereby could increase the overall cost of the IC to unreasonable levels.

It is desirable, then, to effectively provide more signals than provided to an ELA by conventional ELA techniques.

SUMMARY

Exemplary embodiments of the present disclosure overcome the shortcomings in known test systems and thereby satisfy a significant need for effectively testing and debugging an electronics device or system having a logic analyzer. In accordance with an exemplary embodiment, a technique is employed which takes advantage of time-division multiplexing (TDM) multiple signals across the same input bus to an ELA. An ELA conventionally includes or is associated with an input multiplexer to which candidate signals are routed, wherein a group of input signals selected by the input multiplexer is available for sampling and/or triggering an event during the test or debug operation. This input signal group selection is typically made before a test program is executed and remains static for the duration of a corresponding test or debug session. In order to provide more captured signals for a test or debug program, multiple input signal groups can be time division multiplexed over the same input bus. By changing the multiplexer selection signals dynamically during the program and capturing the selection signals along with the selected signals, test/debug software executed on a host computing device is then able to reconstruct the captured multiplexed input signals for presentation to a user without the user needing to know the particulars of the input signal group selection by the input multiplexer.

In accordance with an example embodiment, there is disclosed software program product for testing a device under test having an embedded logic analyzer, the software program product having instructions which, when executed by a computing device associated with the device under test cause the computing device to reconstruct signals of interest in the device under test based at least in part upon signals captured by the embedded logic analyzer during the test or debug session, wherein the signals captured are different from the signals of interest in the device under test. The software program product may further include instructions for causing the computing device to display the reconstructed signals of interest to a user of the computing device. By reconstructing signals of the design under test in this way, knowledge by the user of the particulars of the embedded logic analyzer as well as interface circuitry between the embedded logic analyzer and the design under test are not needed in order to effectively test or debug the design under test.

The software program product may further include instructions for receiving the signals of interest from the user and translating the received signals of interest into the signals to be captured by the embedded logic analyzer during the test and debug session. In another example embodiment, there is disclosed a method for testing a device under test including an embedded logic analyzer as well as input circuitry, the input circuitry having outputs provided to inputs of the embedded logic analyzer, including the acts of receiving an identification of at least one signal in the device under test provided to the input circuitry, for display during a test or debug session of the device under test; translating the identified at least one signal into one or more signals associated with the embedded logic analyzer based at least in part upon information relating to the device under test, the embedded logic analyzer and the input circuitry; receiving, by a computing device, samples of the one or more signals from the embedded logic analyzer, the embedded logic analyzer sampling the one or more signals during the test or debug session; reconstructing, by the computing device, the identified at least one signal based upon the sampled one or more signals received from the embedded logic analyzer; and displaying the reconstructed at least one signal to the user.

Additional features and advantages will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description of the present embodiments of the disclosure and are intended to provide an overview or framework for understanding the nature and character of the invention as it is claimed. The accompanying drawings are included to provide a further understanding of the invention and are incorporated into and constitute a part of this specification. The drawings illustrate various embodiments of the invention and together with the description serve to explain the principles and operation of the invention.

BRIEF DESCRIPTION OF THE DRAWINGS

The above-mentioned and other features and advantages of the various embodiments, and the manner of attaining them, will become more apparent will be better understood by reference to the accompanying drawings, wherein.

DETAILED DESCRIPTION

Figure 1:
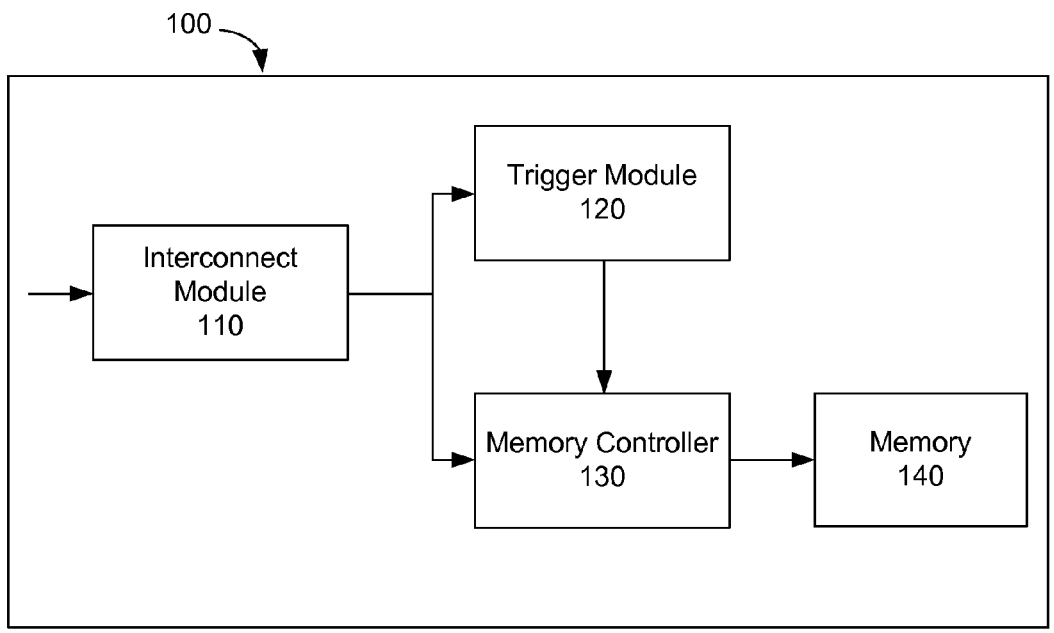
FIG. 1 is a block diagram of a conventional embedded logic analyzer.

Reference will now be made in detail to the exemplary embodiment(s) of the disclosure, as illustrated in the accompanying drawings. Whenever possible, the same reference numerals will be used throughout the drawings to refer to the same or like parts.

Figure 2:
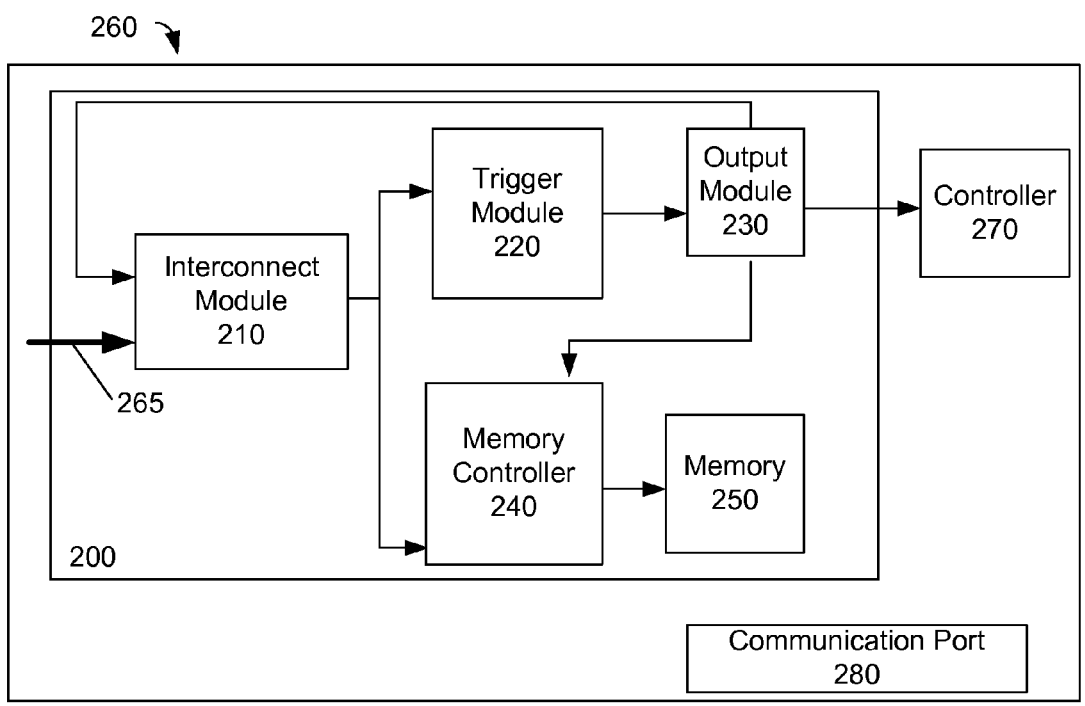
FIG. 2 is a block diagram of one embodiment of an integrated circuit including a logic analyzer.

The present disclosure is directed to a programmable embedded logic analyzer included within an integrated circuit having enhanced analyzing and debugging capabilities. FIG. 2 illustrates one embodiment of an embedded logic analyzer (ELA) 200 disposed on an integrated circuit (IC) 260. The ELA 200 includes an interconnect module 210 that is programmable to select at least one of a plurality of candidate signals within the IC 260. The plurality of candidate signals selected by the interconnect module 210 may include at least one trigger signal and/or at least one signal to be sampled (i.e., a sampled signal). The interconnect module 210 routes the at least one trigger signal to a trigger module 220. The trigger module 220 detects if the at least one trigger signal satisfies at least one trigger condition specified by a user. If the trigger condition is satisfied, an output module 230 performs at least one task. For example, the output module 230 may modify at least one signal within the IC 260.

The IC 260 includes a plurality of buses 265 that carry the plurality of candidate signals. The plurality of signals includes at least one sampled signal and at least one trigger signal. The interconnect module 210 receives the plurality of signals from the plurality of buses 265. The interconnect module 210 is programmable to select at least one sampled signal and/or at least one trigger signal from the plurality of received signals. Essentially, the interconnect module 210 selects the sampled signal(s) and/or trigger signal(s) specified by a user. In one embodiment, the interconnect module 210 may be a multiplexer.

The interconnect module 210 routes the trigger signal to the trigger module 220. The trigger module 220 is programmable to set the trigger condition. The trigger condition may be a single logical operation (e.g., a simple event) or a series of logical operations (e.g., a complex series of events performed by a finite state machine). The trigger module 220 detects if the at least one trigger condition is satisfied by the trigger signal. If the trigger condition is satisfied, the trigger module 220 provides information to the output module 230.

The output module 230 performs at least one task from a group of tasks based upon, in response to, or as a result of the satisfaction of the at least one trigger condition. The group of tasks may include modifying at least one signal from the plurality of received signals, modifying the at least one trigger condition, and initiating a sampling process. In one embodiment, the output module 230 is a field programmable gate array.

If the output module 230 initiates the sampling process, a sampling controller 240 starts sampling the sampled signal from the interconnect module 210. The sampled signal sampled by the sampling controller 240 may be stored in a memory 250. The signals stored in a memory 250 may be transferred to a computer (not shown) for analysis. Such signal transfer to the computer may occur through a communication port 280 such as a USB port. The signals transferred to the computer may then be analyzed by the user.

Figure 3:
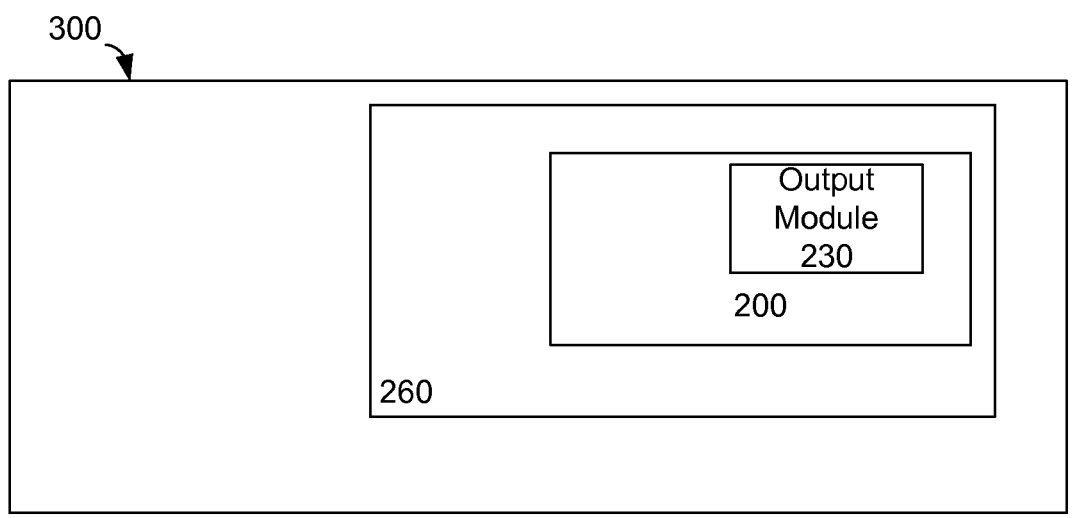
FIG. 3 is a block diagram of an apparatus embedding the integrated circuit of FIG. 2.

While FIG. 2 shows that the memory 250 resides in the ELA 200, it will be appreciated by one of ordinary skill in the art that the memory may be a separate component on the integrated circuit 260 in another embodiment. In yet another embodiment, the memory may be located separately from the integrated circuit 260, provided that it remains communicatively coupled to the ELA. After analyzing the signals, at least one action within an apparatus 300 embedding the IC 260, as shown in FIG. 3, may be performed by configuring or programming the output module 230 to perform a specific task based upon the analysis. For example, the user may debug an error or fault or correct the action of a component of the apparatus 300. Therefore, the apparatus 300 can be diagnosed more effectively to ensure proper functioning of the apparatus 300. In one embodiment, the apparatus 300 may be an imaging device such as a printer, a scanner, or a multi-function device which has the ability to print, scan, fax and/or copy.

The output module 230 may be programmed or configured to modify at least one signal based upon, in response to, or as a result of the satisfied trigger condition. If the satisfied trigger condition indicates an error, the output module 230 may modify at least one signal from the plurality of signals received by the ELA 200 to correct the indicated error. For example, if a value of signal 'X' has to be 30 for error-free operation of the apparatus 300, and if the trigger condition $X \neq 30$ is satisfied, the output module 230 modifies the value of signal X to bring the value of the signal to 30 for error free operation of the apparatus 300.

The output module 230 may also instruct a controller 270 (shown in FIG. 2) to modify at least one signal from the plurality of signals received by the ELA 200 to correct the indicated error. For example, the output module 230 may instruct the controller 270 to turn off a pulse width modulator (PWM) if the PWM that regulates the speed of a motor is detected to be stuck, thereby preventing damage to the motor. The output module 230 may also be capable of stopping a direct memory access (DMA) operation. In addition, the output module 230 may modify the trigger condition, if required. These capabilities of the output module 230 greatly enhance the debugging power of the ELA 200. Therefore, the ELA 200 generally executes a code given below:

IF (<CONDITION>) THEN (<ACTION(S)>), wherein ACTION(S) is at least any one of the above mentioned actions performed by the output module or the controller, and CONDITION is the trigger condition set by the user.

The stored data signals supplied to the interconnect module 210 include a plurality of sampled signals and at least one trigger signal. The interconnect module 210 selects the plurality of sampled signals and at least one trigger signal from the plurality of received data signals. The trigger signal is supplied to the trigger module 220. The trigger module 220 detects if the trigger signal satisfies at least one trigger condition. If the trigger condition is satisfied, the sampling controller 240 samples the plurality of sampled signals from the interconnect module 210. The plurality of sampled signals is stored in the memory 250. The plurality of stored signals along with other stored signals is transferred to the computer for analysis. Therefore, the software, hardware and/or firmware signals can be analyzed simultaneously on the computer.

Figure 4:
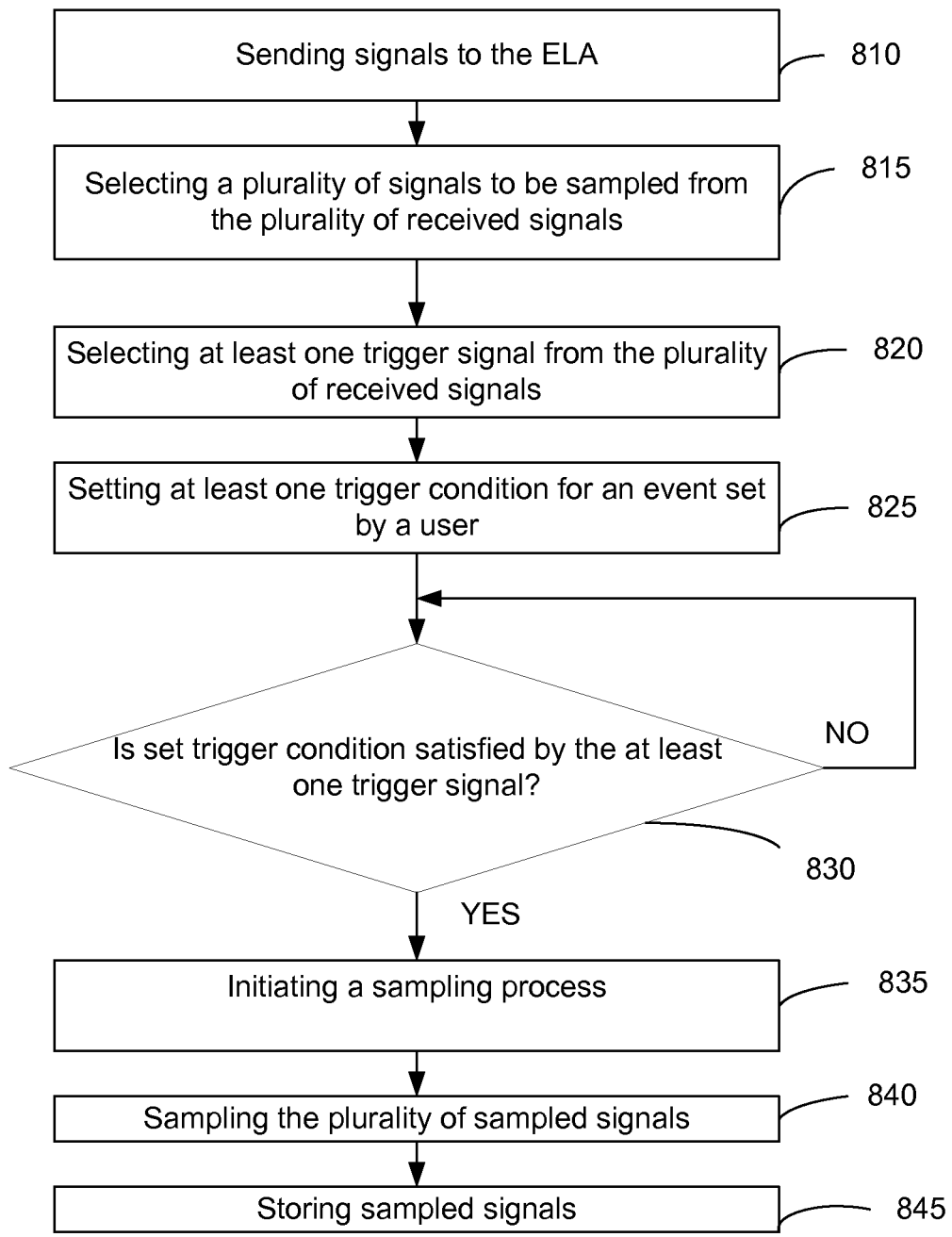
FIG. 4 is a flow chart illustrating the actions performed to capture signals within the integrated circuit of FIG. 2.

FIG. 4 is a flowchart illustrating a method for capturing software signals or events within the IC 260. The circuitry under test disposed on the IC 260 supplies a plurality of signals to the interconnect module 210 of ELA 200 at block 810. The interconnect module 210 is programmed to select a plurality of signals that is to be sampled from the plurality of received signals (block 815). The interconnect module 210 is also programmed to select at least one trigger signal from the plurality of received signals (block 820). The user sets within the trigger module 220 at least one trigger condition for an event (block 825). The trigger module 220 detects if the set trigger condition is satisfied by the at least one trigger signal (block 830). If the trigger condition is satisfied, the trigger module 220 initiates the sampling process at block 835. Otherwise, the trigger module repeats the detection of a satisfied set trigger condition.

Upon the initiation of the sampling process, the sampling controller 240 samples the plurality of software signals that is to be sampled from the interconnect module 210 (block 840). The sampled signals may then be stored in the memory 250 at block 845. The stored signals may also be transferred to the computer for analysis by a program running on the computer or by a user.

Figure 5:
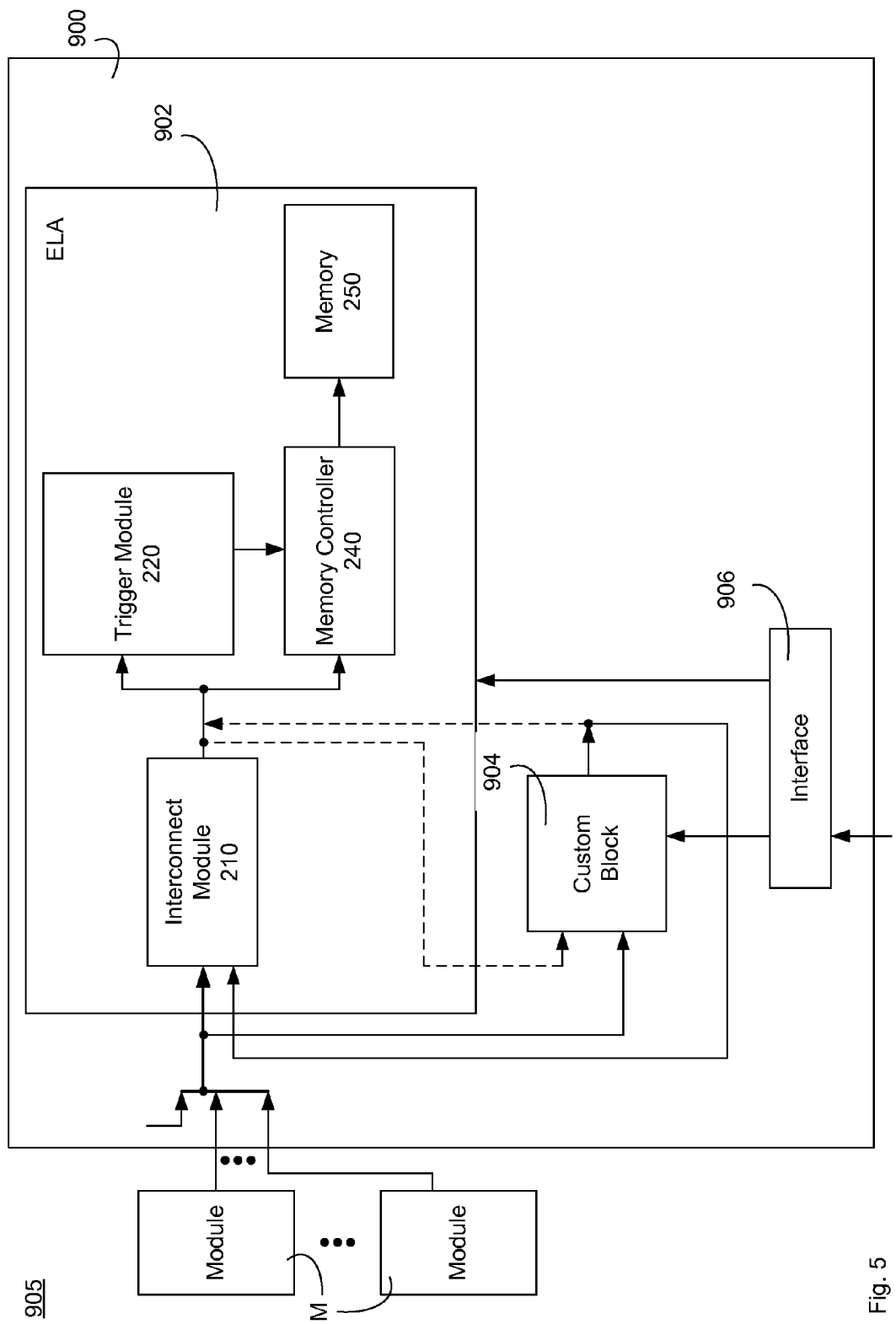
FIG. 5 is a block diagram illustrating a system having an integrated circuit according to an exemplary embodiment.

FIG. 5 illustrates a system integrated circuit 900 according to another embodiment of the present disclosure. Integrated circuit 900 may be disposed in a system 905 having a plurality of modules M. Integrated circuit 900 may include an embedded logic analyzer 902 having an interconnect module 210, trigger module 220, memory controller 240 and memory 250. Embedded logic analyzer 902 may be coupled with the system modules M so that embedded logic analyzer 902 may be used to effectively test or debug system 905 in which it is disposed.

It is further understood that the phrases "test" and "debug" are intended to include those operations typically performed during development, testing, debugging, system analysis and in-field monitoring and servicing of the system and its system modules M, and is not intended to be limited to only one phase or time period of system activity from design through the usable life of the system.

Integrated circuit 900 may also include a custom block 904 which receives one or more signals associated with embedded logic analyzer 902. In particular, custom block 904 may receive as an input one or more signals provided to embedded logic analyzer 902 from the other modules M of the system. Such signals may include signals that are available for sampling or event triggering by embedded logic analyzer 902. Custom block 904 may generate at its output one or more output signals that are based upon the one or more received input signals and which are fed back into embedded logic analyzer 902 for sampling or triggering. By providing to embedded logic analyzer 902 one or more additional signals for sampling and/or event triggering that is based upon signals associated with embedded logic analyzer 902, embedded logic analyzer 902 may more efficiently debug a system in which integrated circuit 900 is disposed.

Custom block 904 may include circuitry that is specific to the particular system and/or system modules M which are available for test and/or debug using embedded logic analyzer 902. In an exemplary embodiment of the present disclosure, custom block 904 is configurable so that the signals generated thereby may be configurable. Having custom block 904 configurable advantageously allows for substantial flexibility for testing and/or debugging a wide variety of system modules M and system signals generated thereby. Custom block 904 may be implemented as a FPGA or CPLD. Alternatively, custom block 904 may be implemented with a processor having memory coupled thereto for storing code for execution by the processor. By having the memory accessible for loading different code, custom block 904 may provide sufficient flexibility to test and/or debug a substantially large number of different system modules M. In yet another alternative, custom block 904 may include state machine circuitry that is programmable in part by programming and/or storing information into registers that are located in or associated with the state machine. It is understood that custom block 904 may be implemented in any number of ways to provide configurable functionality and signal generation.

As shown in FIG. 5, custom block 904 may receive one or more signals that are provided to embedded logic analyzer 902. Such signals provided to embedded logic analyzer 902 may be received by custom block 904 by directly coupling one or more inputs of custom block 904 to one or more inputs of embedded logic analyzer 902. In addition or in the alternative, such signals provided to embedded logic analyzer may be received by custom block 904 by directly coupling one or more inputs of custom block 904 to one or more outputs of interconnect module 210 that are to trigger an event and/or to be sampled, as shown in dotted lines in FIG. 5. As further shown in FIG. 5, the output of custom block 904 may provide to embedded logic analyzer 902 one or more output signals for event triggering or sampling. Such one or more output signals may be provided to embedded logic analyzer 902 by directly coupling the output of custom block 904 to an input of embedded logic analyzer 902. In addition or in the alternative, such one or more output signals may be provided to embedded logic analyzer 902 by directly coupling the output of custom block 904 to an input of trigger module 220 and/or an input of memory controller 240, as shown in dotted lines in FIG. 5.

Integrated circuit 900 may further include an interface 906 which may be used for accessing custom block 904 and embedded logic analyzer 902. In particular, interface 906 may provide a wired or wireless connection with a network device on a network, such as a remote host (not shown). Interface 906 may provide the necessary interface between the network device and various blocks in integrated circuit 900, including embedded logic analyzer 902 and custom block 904. Embedded logic analyzer 902, and particularly interconnect module 210 and trigger module 220, may be controlled, configured and/or programmed using interface 906. In addition, the data sampled by embedded logic analyzer 902 may be downloaded to a network device for analysis via interface 906.

As mentioned above, custom block 904 may be accessible using interface 906. For example, in the event custom block 904 is reconfigurable and/or programmable, custom block 904 may be configured by a network device using interface 906 to generate one or more output signals tailored to the particular system modules M being tested or debugged. In addition or in the alternative, custom block 904 may be controlled by a remote host during system test or debug using interface 906. As a result, custom block 904 may be configured at runtime of a system level test or debug session.

FIG. 5 shows custom block 904 being separate from embedded logic analyzer 902 in integrated circuit 900. It is understood that, alternatively, custom block 904 may be located within embedded logic analyzer 902 in integrated circuit 900 and be coupled to interconnect module 210, trigger module 220 and memory controller 240 as described above.

Figure 6:
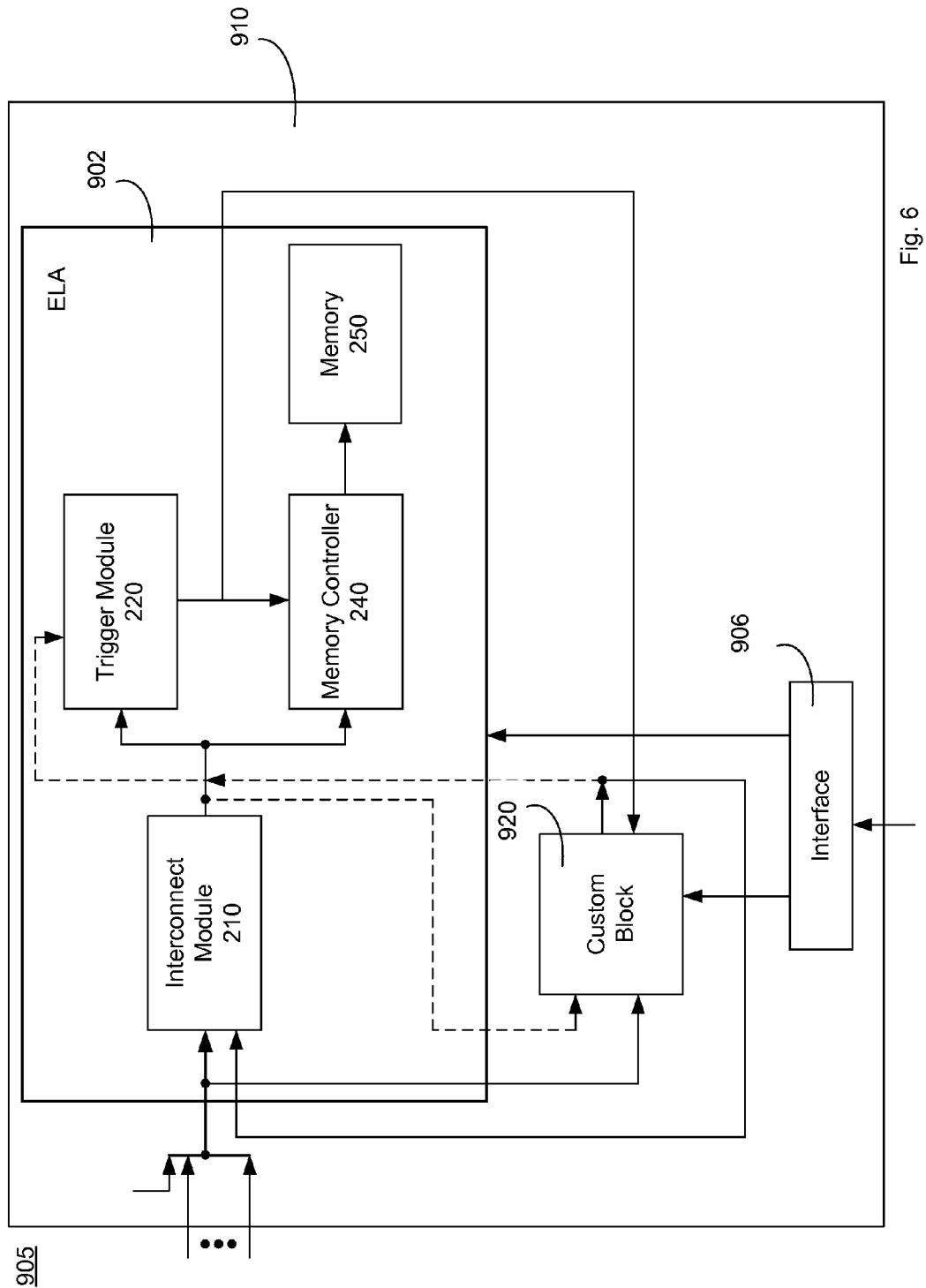
FIG. 6 is a block diagram illustrating a system having an integrated circuit according to an exemplary embodiment.

FIG. 6 illustrates an integrated circuit 910 of system 905 according to another exemplary embodiment of the present disclosure. Integrated circuit 910 may include embedded logic analyzer 902 as described above with respect to FIG. 5, having interconnect module 210, trigger module 220, memory controller 240 and memory 250. Integrated circuit 910 may also include a custom block 920 for generating one or more signals for sampling or event triggering by embedded logic analyzer 902, based upon signals provided to and/or generated within embedded logic analyzer 902.

Like custom block 904 in FIG. 5, custom block 920 is coupled to embedded logic analyzer 902 to receive as an input one or more signals provided to embedded logic analyzer 902. Custom block 920, like custom block 904, may generate one or more output signals based upon one or more received input signals which is provided to embedded logic analyzer 902, trigger module 220 (for event triggering) and/or memory controller 240 (for selective sampling). Similar to custom block 904, custom block 920 may include circuitry that is specific to the system modules M that are capable of being tested or debugged by embedded logic analyzer 902. In one embodiment, the functions performed by custom block 920 in generating one or more output signals may be configurable and/or programmable using FPGA or CPLD circuitry, a processor executing downloaded test/debug code, state machine circuitry, etc. Interface 906 may be coupled to custom block 920 for providing access thereto so that custom block may be controlled, configured and/or programmed using a network device, such as a host device.

Further, custom block 920 may receive as an input one or more signals generated by trigger module 220. In particular, one or more trigger signals generated by trigger module 220, which indicates the detection of at least one event, may be provided as an input to custom block 920. One or more output signals generated by custom block 920 may be based upon the one or more trigger signals generated by trigger module 220. In this way, an output signal generated by custom block 920 may be defined based upon signals generated by system modules M under test or debug as well as actions that are defined and executed at runtime of a test or debug session.

For example, a trigger signal generated by trigger module 220 of embedded logic analyzer 902 and provided to custom block 920 may be used to selectively enable signal generating circuitry within custom block 920. In one implementation, custom block 920 may be configured as an accumulator to count a number of events, such as the number of words read from memory by a direct memory access (DMA) system module. One testing or debugging the system selects the DMA module to monitor and controls, programs and/or configures trigger module 220 accordingly using interface 906. A trigger program by which trigger module 220 is configured may include an action to trigger accumulation. Upon detection of the condition of one or more signals provided to trigger module 220, a trigger signal generated by trigger module 220 indicates detection of the condition and enables the accumulator configured within custom block 920 to begin accumulating in synchronicity with a clock signal (not shown). Trigger module 220 may also, either via the same trigger signal used to enable the accumulator or a different trigger signal, disable the accumulator following its enablement. The signal used for disabling may be driven by circuitry that is configurable and/or programmable and detect the occurrence of at least one trigger event relating to one or more signals received by trigger module 220. Following disablement, the output of the accumulator may be provided to the input of embedded logic analyzer 902 for selective sampling by memory controller 240 or event triggering by trigger module 220. By controlling the accumulator function within custom block 920 to accumulate only upon the occurrence of a user specified trigger event and providing the accumulated result to embedded logic analyzer 902, substantially less memory is needed to store samples of the output of the accumulator function than would otherwise be necessary in order to count the number of words read by the DMA system module.

Figure 7:
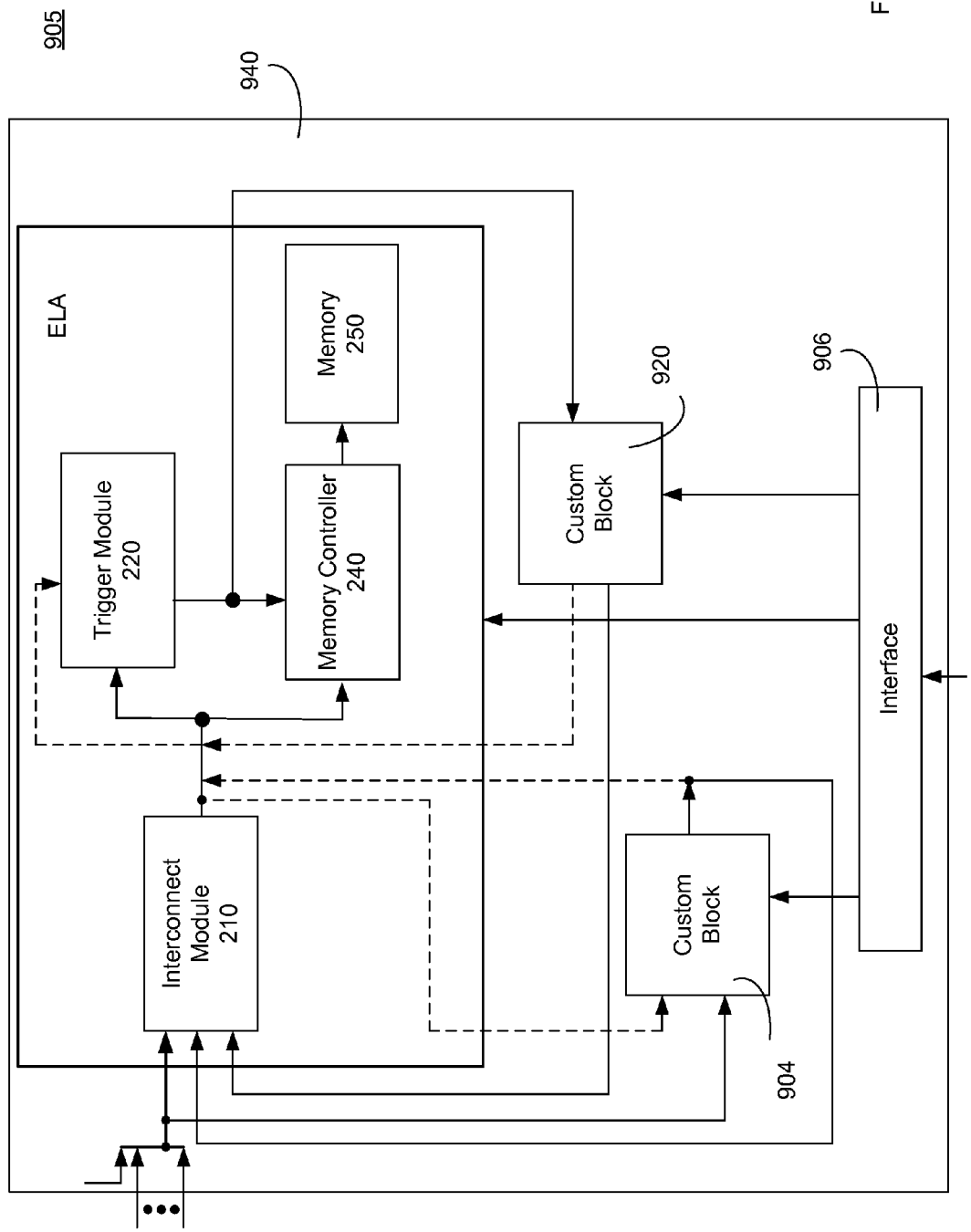
FIG. 7 is a block diagram illustrating a system having an integrated circuit according to an exemplary embodiment.

It is understood that custom blocks 904 and 920 may be utilized in the same integrated circuit chip. FIG. 7 illustrates such an integrated circuit 940 of system 905 according to an exemplary embodiment of the present disclosure, including both custom blocks 904 and 920.

It is understood that integrated circuits 900, 910 and 940 may be used in virtually any system which may benefit from an embedded mechanism to facilitate the efficient testing and debugging of the system and the system modules M thereof. For example, a printer, all-in-one printing device or multi-function printer may include integrated circuit 900.

Use of custom blocks 904 and 920 has been seen to substantially reduce the amount of memory necessary for storing signals sampled by embedded logic analyzer 902. For instance, a printer or other imaging device may include a serial interface for providing to the printer printhead print data for an entire print job, which may require gigabytes of storage. If it is desired to know the number of times a specific nozzle in the printhead fires, custom block 904 or 920 may be configured to receive the signal from the serial interface and generate a signal indicative of the particular nozzle firing, without any information relating to any other nozzle of the printhead. The generated signal may be provided as an input to embedded logic analyzer 902 for selectively sampling during a test/debug session. Sampling and storage in memory of the custom generated signal has been seen to occupy only kilobytes of memory, substantially less than the amount of memory needed to sample and store the entire serial interface.

Figure 8:
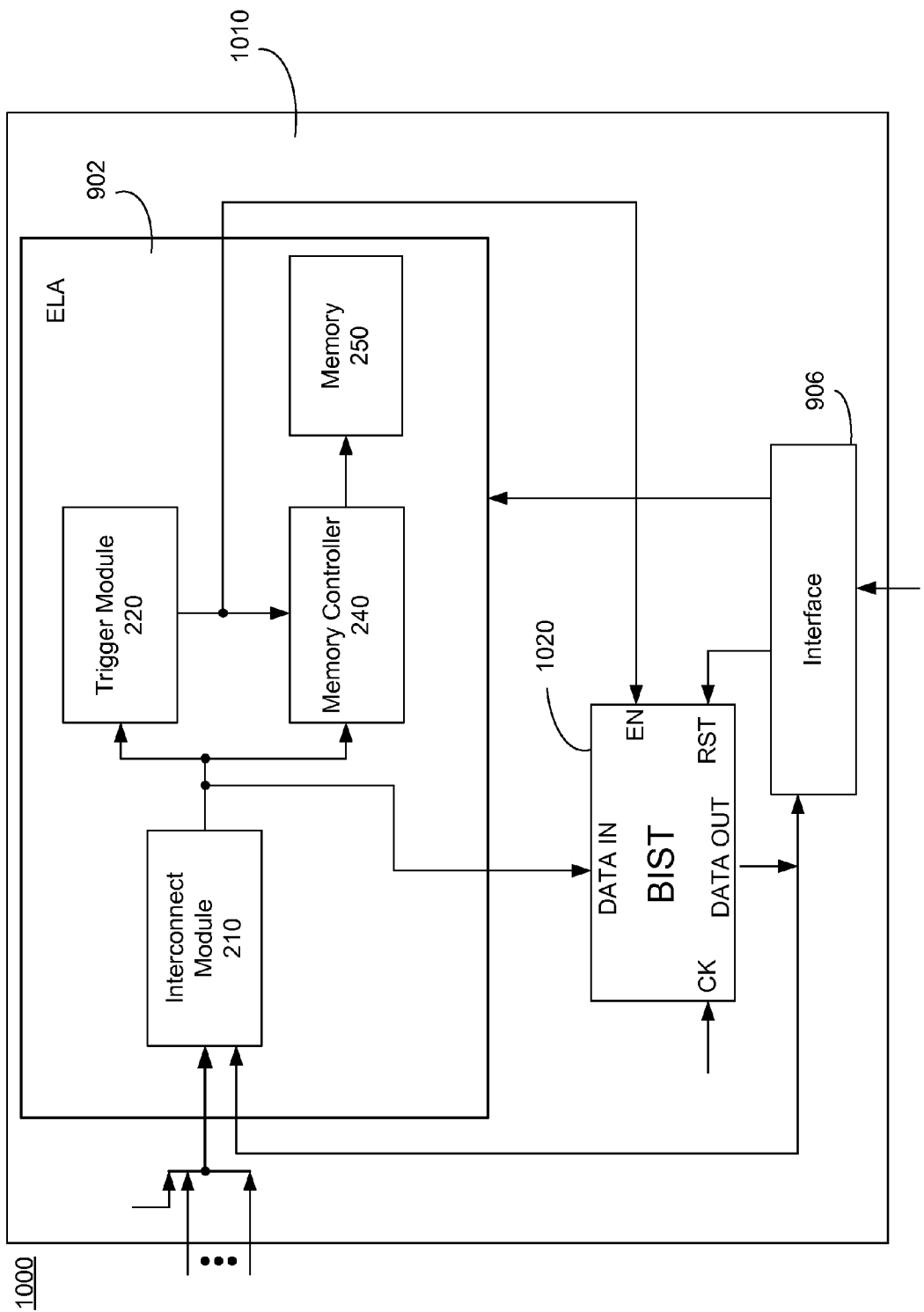
FIG. 8 is a block diagram illustrating a system having a BIST block associated with a logic analyzer according to another exemplary embodiment.

FIG. 8 is a block diagram of an integrated circuit 1010 in a system 1000 according to another embodiment. Integrated circuit 1010 may include embedded logic analyzer 902 having interconnect module 210, trigger module 220, memory controller 240 and memory 250 communicatively coupled together as described above. Embedded logic analyzer 902 may receive signals generated by system modules appearing in system 1000. Integrated circuit 1010 may further include built in self test (BIST) block 1020 coupled to embedded logic analyzer 902. In general terms, BIST block 1020 has stored therein a signature and creates a new signature by capturing a signal or set of signals at particular times as determined by the status of an enable input signal and clock signal. The new signature is thus based upon the previously stored signature as well as the signals captured. By capturing signals associated with embedded logic analyzer 902 numerous times throughout a test or debug procedure, for example, the signature stored in BIST block 1020 may indicate whether the system under test is performing correctly by simply comparing the stored signature to an expected value.

As shown in FIG. 8, BIST block 1020 may be coupled to embedded logic analyzer 902 for receiving as data inputs one or more signals received thereby. For example, a data input of BIST block 1020 may be coupled to one or more outputs of interconnect module 210 for receiving one or more signals thereat. BIST block 1020 may include an enable input for selectively enabling the capture of signals appearing at its data input and thereby creating a new signature. During the time the signal appearing at the enable input is asserted, signals appearing at the data input of BIST block 1020 are captured and a new signature is generated upon the occurrence of each triggering edge of the signal appearing at the clock input of the BIST block 1020. The enable input of BIST block 1020 may be coupled to an output of trigger module 220 for receiving at least one signal therefrom. In this way, upon the detection of at least one event by trigger module 220, BIST block 1020 captures a set of one or more signals appearing at its data input and thereby generates a new signature with each triggering edge of the received clock signal. The clock input of BIST block 1020 for controlling signal capture and new signature generation may be coupled to a system clock or a test clock used to synchronize operations within embedded logic analyzer 902, for example.

Following enabling of BIST block 1020, trigger module 220 may generate a signal that is provided to BIST block 1020 to disable it. In particular, the trigger module 220 may be configured or otherwise programmed to disable BIST block 1020 following its enablement. For instance, trigger module 220 may disable BIST block 1020 in response to the detection of a trigger event that is based upon one or more signals received by trigger module 220. The particulars of the trigger event may be configured or programmed at runtime of a test or debug session, like any other trigger event monitored by trigger module 220. The trigger event for disabling BIST block 1020, for example, may be based in part upon a predetermined period of time lapsing following its enablement, wherein the predetermined period of time is configured or otherwise programmed at runtime. It is understood, though that the trigger event may be based upon any of a number of functions or operations defined within trigger module 220 and upon one or more signals received thereby.

The stored signature of BIST block 1020 may be provided at the data output thereof, which may be coupled to embedded logic analyzer 902 for triggering an event or storing therein. For example, the data output of BIST block 1020 may be coupled to an input of embedded logic analyzer 902 so that the data output is applied to an input of interconnect module 210. In addition or in the alternative, the data output of BIST block 1020 may be directly coupled to an input of trigger module 220 and/or memory controller 240. As a result, the signature maintained in BIST block 1020 may be utilized by embedded logic analyzer 902 as any other signal associated therewith.

BIST block 1020 may be coupled to interface 906 for providing direct user access to the stored signature, as shown in FIG. 8. Interface 906 being coupled to BIST block 1020 may also allow for BIST block 1020 to be relatively easily placed in a predetermined state, as will be explained in greater detail below.

Figure 9:
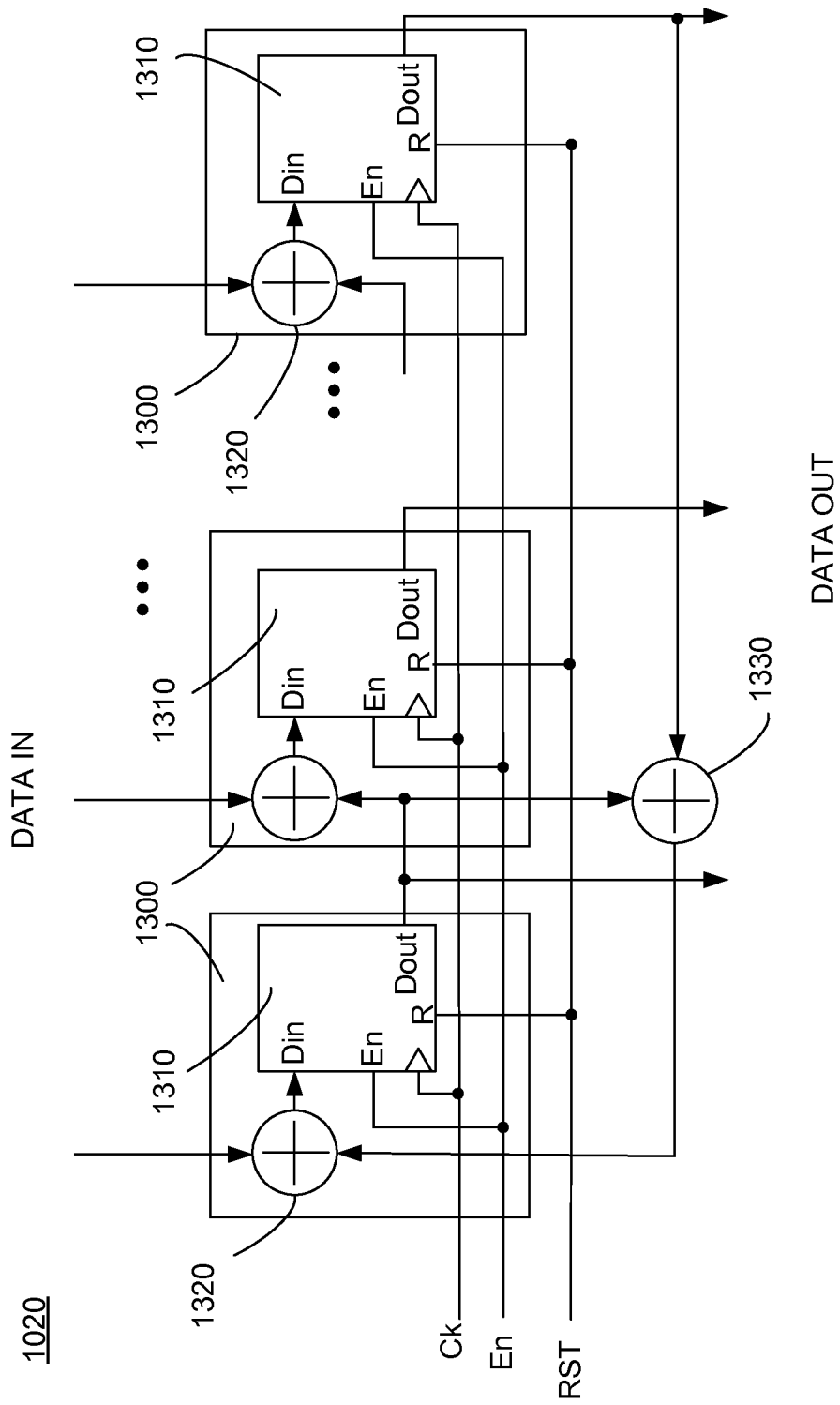
FIG. 9 is a block diagram of the BIST block of FIG. 8.

FIG. 9 illustrates one possible implementation of BIST block 1020. BIST block 1020 may include a number of serially connected bit slices 1300 which combine to serve as a linear feedback shift register. Specifically, each bit slice 1300 may include a latch, such as a D-type flip flop 1310, having a data input, a clock input, a reset input, a clock enable input and a data output. The clock input of each flip flop 1310 may be coupled together to the same input of BIST block 1020, and the clock enable of each flip flop 1310 may also be coupled together to the same input of BIST block 1020, as shown in FIG. 9. As a result, flip flops 1310 of BIST block 1020 may be clocked and enabled by the same signals.

Each bit slice 1300 may further include at least one logic gate 1320, such as an exclusive OR logic gate, having a first input coupled to a data input of BIST block 1020, a second input and an output which is coupled to the data input of flip flop 1310. The data output of a flip flop 1310 may be coupled to the input of the next flip flop 1310 in the serial shift register chain via the second input of the logic gate 1320 in the next flip flop 1310, as shown in FIG. 9. Further, the second input of the logic gate 1320 in the first and/or most upstream bit slice 1300 in the serial shift register chain may be coupled to one or more data outputs of flip flops 1310 of bit slices 1300 in the serial shift register chain via logic gate (exclusive OR gate) 1330. The data output of each flip flop 1310 of bit slices 1300 may be coupled to the data output of BIST block 1020.

It is desirable to place flip flops 1310 in a known, predetermined state at the beginning of a test or debug session, for example. Accordingly, BIST block 1020 may include a reset input which is coupled to the reset input of each flip flop 1310, the assertion of which places flip flops 1310 in a predetermined or reset state. It is understood that flip flops 1310 may all have the same Boolean state as the predetermined or reset state, or that some flip flops 1310 may have a first Boolean state as the predetermined state while other flip flops 1310 may have a second Boolean state as the predetermined state. The reset input of BIST block 1020 may be coupled to interface 906 so that flip flops 1310 may be relatively easily placed in the predetermined state.

It is understood that BIST block 1020, and more particularly bit slices 1300, may be implemented in any number of ways while still performing as a linear feedback shift register or the like to create a signature based upon a previously maintained signature and upon signals captured upon the occurrence of each triggering edge of a clock signal.

Figure 10:
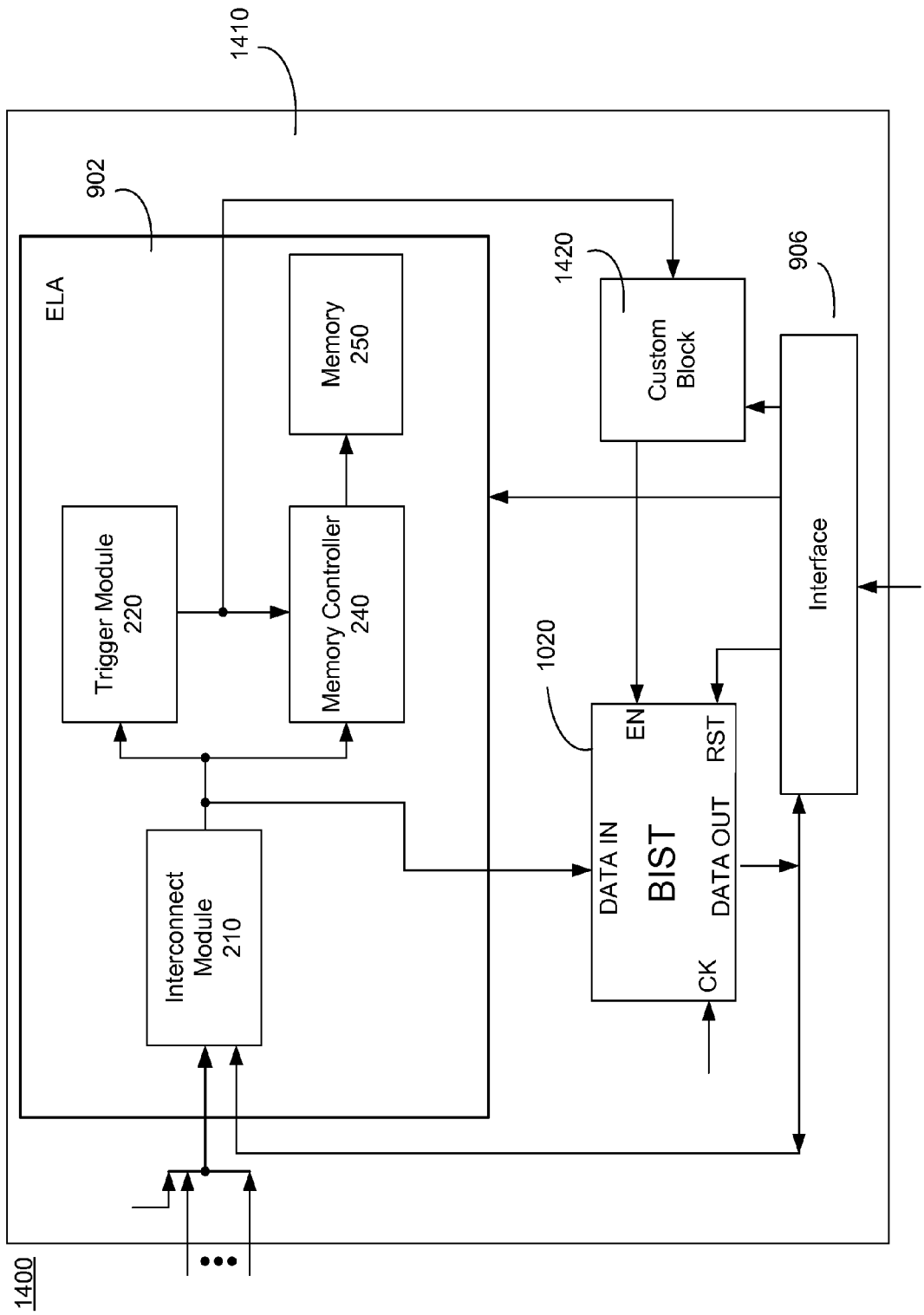
FIG. 10 is a block diagram of a system including an integrated circuit having a BIST block associated with a logic analyzer according to another exemplary embodiment.

FIG. 10 is a block diagram of system 1400 according to another embodiment. System 1400 may include integrated circuit 1410 having embedded logic analyzer 902 which may include interconnect module 210, trigger module 220, memory controller 240 and memory 250 as described above, and receive signals from various system modules for test or debug. In addition, integrated circuit 1410 may include BIST block 1020 as described above with respect to FIG. 9, having a data input and a data output coupled to embedded logic analyzer 902 as well as an enable input. Interface 906 may be coupled to embedded logic analyzer 902 and BIST block 1020 for providing user access thereto. In addition, integrated circuit 1410 may include a custom block 1420.

Custom block 1420 may be connected between trigger module 220 of embedded logic analyzer 902 and BIST block 1020. In particular, custom block 1420 may include an input coupled to at least one output of trigger module 220, and an output coupled to the enable input of BIST block 1020. Custom block 1420 may generate at least one signal at its output which is based upon the detection of at least one triggering event by trigger module 220.

Similar to custom block 920, custom block 1420 may include circuitry that is specific to the system modules M that are capable of being tested or debugged by embedded logic analyzer 902. In one embodiment, the functions performed by custom block 1420 in generating one or more output signals may be configurable and/or programmable using FPGA or CPLD circuitry, a processor executing downloaded test/debug code, state machine circuitry, etc. Interface 906 may be coupled to custom block 1420 for providing access thereto so that custom block 1420 may be controlled, configured and/or programmed using a network device, such as a host device.

As mentioned, custom block 1420 may receive as an input one or more signals generated by trigger module 220. In particular, one or more trigger signals generated by trigger module 220, which indicates the detection of at least one event, may be provided as an input to custom block 1420. One or more output signals generated by custom block 1420 and provided to BIST block 1020 thus may be based upon the one or more trigger signals generated by trigger module 220 as well as the functions that are configured and/or programmed in custom block 1420. In this way, an output signal generated by custom block 1420 which selectively enables BIST block 1020 may be defined based upon signals generated by system modules M under test or debug as well as actions and functions that are defined and executed at runtime of a test or debug session.

The one or more output signals generated by custom block 1420 that enables BIST block 1020 may also serve to disable BIST block 1020. Such one or more signals may disable BIST block 1020 based upon the detection of one or more trigger events by trigger module 220 and/or upon a predetermined function defined in custom block 1420. The predetermined function, which may be configured or otherwise programmed at runtime of a test or debug session, may include a timer function which disables BIST block 1020 a predetermined period of time following its enablement. It is understood, though, that the signal which disables BIST block 1020 may be based in part upon virtually any predetermined function defined in custom block 1420.

Figure 11:
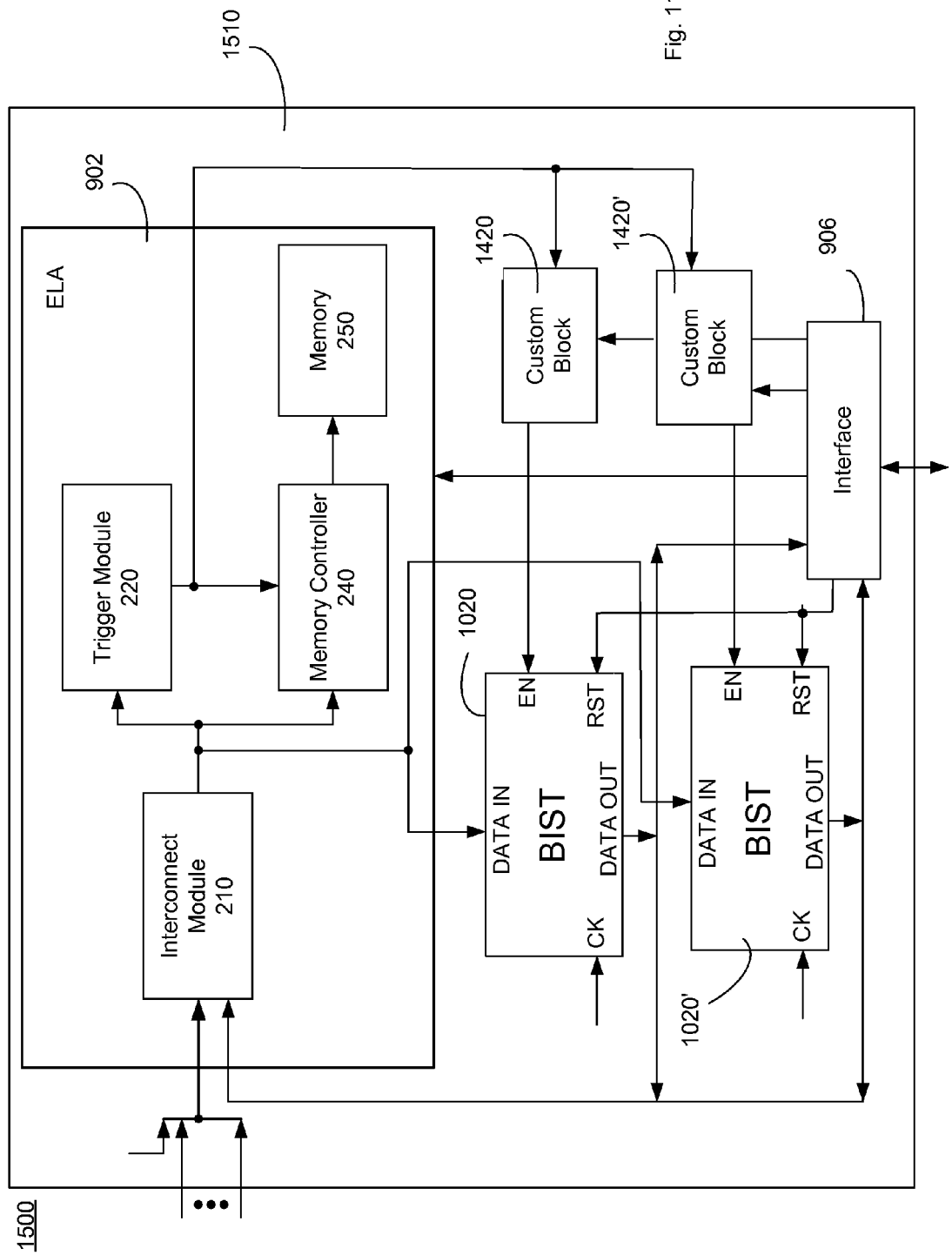
FIG. 11 is a block diagram of a system including an integrated circuit having a BIST block associated with a logic analyzer according to another exemplary embodiment.

It is further understood that integrated circuits 1010 and 1410 may include more than one BIST block 1020 so that multiple signatures may be separately maintained and generated during a test or debug session. FIG. 11 illustrates a system 1500 having integrated circuit 1510 which includes multiple BIST blocks 1020 and 1020', each of which receives one or more signals from embedded logic analyzer 902. In particular, each BIST block 1020, 1020' may receive a distinct set of one or more signals from or associated with embedded logic analyzer 902, such as signals appearing at the output of interconnect module 210. The output of each BIST block 1020, 1020' may be coupled to embedded logic analyzer 902 for sampling or storing therein. For example, the data output of each BIST block 1020, 1020' may be coupled to an input of embedded logic analyzer 902, as shown in FIG. 11.

Each BIST block 1020, 1020' may be separately enabled and disabled for signature generation. In particular, the enable/disable input of each BIST block 1020 and 1020' may be coupled to the output of a distinct custom block 1420 and 1420', respectively. Each custom block 1420, 1420' may receive at an input thereof one or more signals from trigger module 220. The one or more signals received from trigger module 220 by each custom block 1420, 1420' may be distinct relative to the one or more signals received by the other custom block 1420, 1420'. In addition, each custom block 1420, 1420' may be separately programmed and/or configured by a host device using interface 906. As a result, custom blocks 1420 and 1420' may be capable of separately and independently enabling and disabling its corresponding BIST block 1020 and 1020', respectively. It is understood that system 1500 may include more than two BIST blocks 1020 and 1020' depending upon the system modules M to be tested and debugged.

Figure 12A:
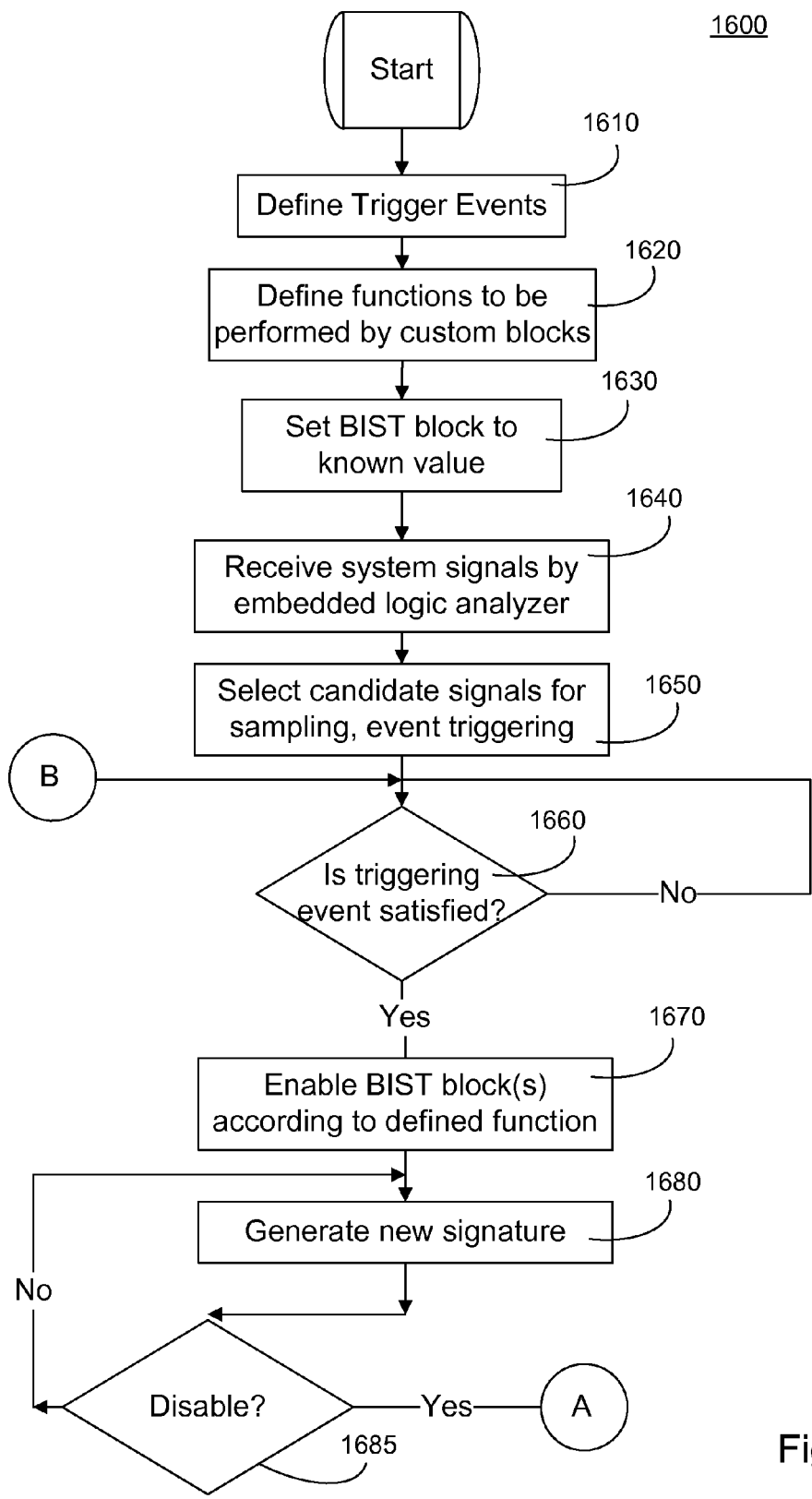
FIGS. 12a and 12b show a flowchart illustrating the operation of a system of FIGS. 8, 10 and 11.
Figure 12B:
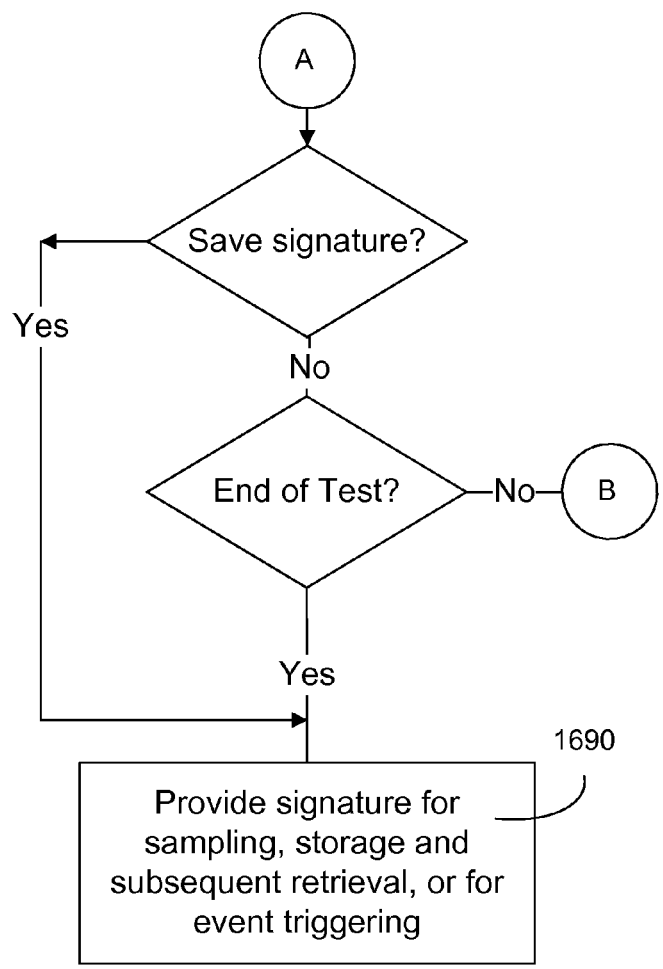

The operation of systems 1400 and 1500 will be described with reference to FIGS. 12a and 12b. At runtime of a test or debug session, trigger events are defined at 1610 for configuring the trigger events that trigger module 200 is to detect during the session. At around the same time, the functions performed by custom blocks 1420 and 1420' are defined at 1620 so that custom blocks 1420 and 1420' generate enable signals for BIST blocks 1020 and 1020', respectively, according to desired functions that may be based upon the particular system modules M being tested or debugged. This may be accomplished by programming programmable circuitry in custom blocks 1420 and 1420'. In the event custom blocks 1420 and 1420' include a processor, this defining may be accomplished by loading code into memory that is accessible by the processor for execution. It is understood that defining the functions to be performed by custom blocks 1420 and 1420' depends upon the particular implementations of such blocks.

Also at runtime, each of BIST blocks 1020 and 1020' may be placed in its known, predetermined state at 1630 using interface 906. Next, during the system test or debug session, at 1640 embedded logic analyzer 902 may receive signals from one or more system modules M. During this time, embedded logic analyzer 902 may select at 1650 certain signals from the received signals as candidate signals. This selection may be performed by interconnect module 210. One or more of the selected candidate signals may be used by trigger module 220 for detecting for the occurrence of a previously defined trigger event, while other candidate signals may be available for signal capture in response to such detection.

Next, a determination may be made at 1660 by trigger module 220 whether one or more previously defined trigger events have occurred. Upon an affirmative determination that a trigger event has occurred, one or more candidate signals may be captured by memory controller 240 and stored in memory 250. In addition or in the alternative, the detection of a trigger event by trigger module 220 may cause, at least in part, at least one of custom blocks 1420 and 1420' to generate an enable signal at 1670 for enabling a corresponding BIST block 1020 and 1020', respectively, depending upon the function previously defined at 1620. In the event a custom block 1420 enables its corresponding BIST block 1020 at least partly in response to the detection of a trigger event, a new signature is generated at 1680 at each clock pulse based upon the previously maintained signature and upon the signals appearing at the data input of BIST block 1020.

At some point in the test or debug session following detection of a trigger event at 1660, another trigger event may occur at 1685 to disable the previously enabled BIST block 1020. This trigger event may be detected, for example, by trigger module 220 based upon one or more of the candidate signals selected at 1650. Alternatively, such trigger event may be based upon the lapse of a predetermined period of time following the enablement of BIST block 1020 or following the detection of the trigger event in 1660, as monitored by trigger module 220 or custom block 1420. Upon the detection of the trigger event at 1685, BIST block 1020 may be disabled which thereby inhibits further signature generation. At this point, the signature generated by BIST block 1020 may be provided to embedded logic analyzer 902 at 1690 for sampling and storage or for event triggering therein. The signature may also be provided over interface 906 for analysis.

If the test or debug session is not complete, operation may resume at 1660 for determining whether another trigger event has occurred, or at 1650 for selecting another group of signals to serve as candidate signals.

The generated signature may be provided at 1690 to embedded logic analyzer 902 for initiating a trigger event or for signal capture by memory controller 240 for storage in memory 250. This may occur following BIST block 1020 no longer being enabled. In the event the generated signature is captured and stored in memory 250, the signature may be thereafter retrieved for analysis. Such analysis may include comparing the retrieved signature to an expected signature value identified through system simulation, and determining that the system is operating correctly if the retrieved signature matches the expected signature value.

It is understood that any one or more of BIST blocks 1020 and 1020' and custom blocks 1420 and 1420' may be included within logic analyzer 902. It is further understood that integrated circuits 1010, 1410 and 1510 may be used in virtually any system which may benefit from an embedded mechanism to facilitate the efficient testing and debugging of the system and the system modules M thereof. For example, a printer, all-in-one printing device or multifunction printer may include integrated circuit 900.

A mechanism for testing and debugging a system may include, in addition to custom blocks 904 and 920, software to communicate with embedded logic analyzer 902 and custom blocks 904 and 920. The software provides the user with the ability to select in-system options for such blocks and control or otherwise program them after the system has been synthesized and/or assembled, such as at runtime of a system test or debug session. The software, including a user interface, provides communication with embedded logic analyzer 902 and blocks 904 and 920 via interface 906. The software may be used to receive at a remote device the data sampled and stored by embedded logic analyzer 902 and display the signals to the remote device user.

Figure 13:
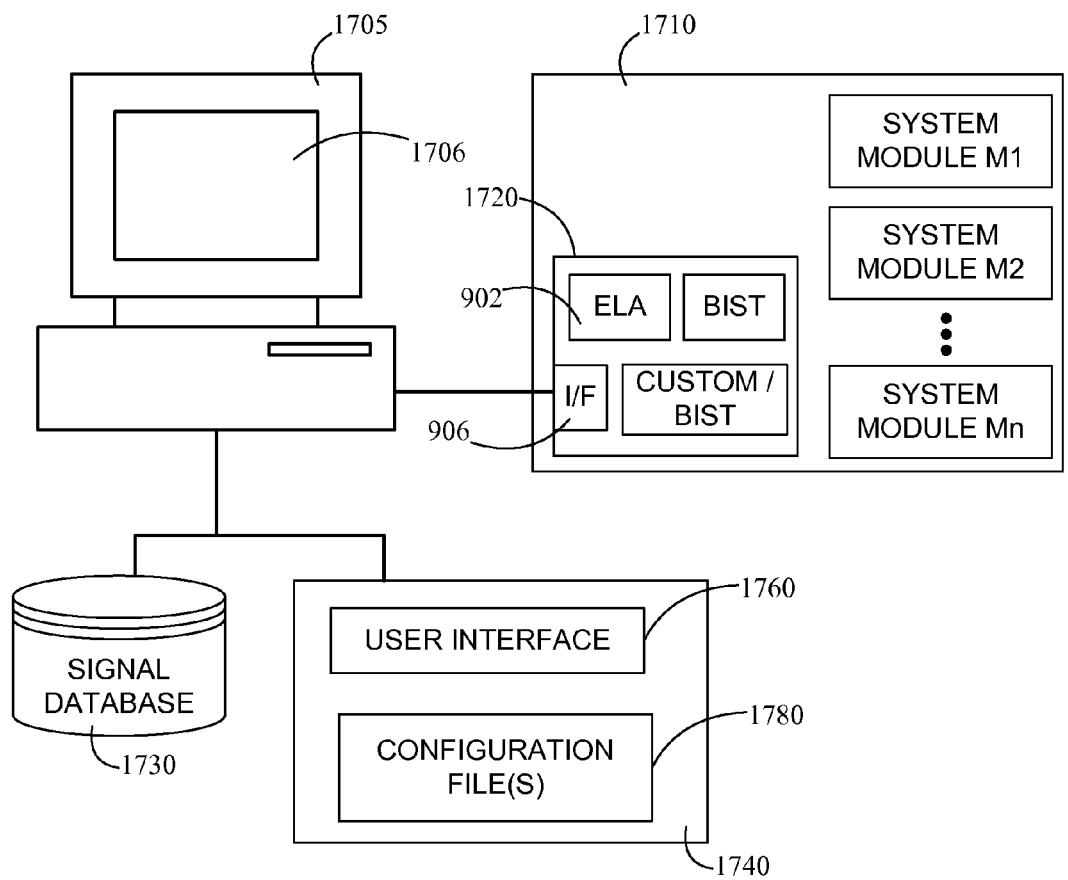
FIG. 13 is a block diagram of a test system for testing and/or debugging the systems of FIGS. 5-11.

FIG. 13 illustrates a test and debug system 1700 according to an example embodiment. System 1700 may include a host computing device 1705 for controlling a test or debug session. A system under test 1710 may include one or more system modules M1-Mn, any one or more of which may be tested or debugged during such a session. System under test 1710 may further include an integrated circuit 1720 having embedded logic analyzer 902 coupled to one or more custom blocks and/or BIST blocks as described above with respect to FIGS. 5-12. Integrated circuit 1720 may further include interface 906 for providing a communications interface to computing device 1705, as described above.

Associated with computing device 1705 may be a database 1730 which includes information about signals associated with embedded logic analyzer 902. For example, signal database 1730 identifies a list of I/O signals of embedded logic analyzer 902, including signals received from and provided to custom blocks 904, 920 and BIST blocks 1020 and 1020'. Signal database 1730 may be created prior to a test or debug session. Signal database 1730 may also include signal attributes selectively assigned to signals in signal database 1730 by a system user, as will be discussed in greater detail below.

A memory 1740 may be coupled to computing device 1705 and include therein user interface software 1760 which when executed by a processor within computing device 1705 (not shown) provides a user interface for assisting a user to set up and run a test or debug session on system under test 1710. Also stored in memory 1740 may be one or more configuration files which, in general terms, may be used for providing information associated with signals captured and provided by embedded logic analyzer 902 in a form that is easier for a user to read and understand. Such signals may include signals generated by custom blocks 904 and 920 as well as BIST blocks 1020 and 1020'.

For example, user interface 1760 allows for identifying certain signals by signal type and, when the captured signals are provided by embedded logic analyzer 902 during a test or debug session, user interface 1760 determines the type of signal to display based upon the identified signal type. Specifically, user interface 1760 allows for one or more signals to be tagged or associated with a signal attribute, hereinafter called a type attribute. The signals may be tagged with a type attribute using user interface 1760 and such tagged attribute may be stored in signal database 1730. Alternatively, a signal may be tagged with a type attribute at runtime/compilation using user interface 1760, just prior to the commencement of a test or debug operation.

Configuration file 1780 defines the data display visualizations for each type attribute. In other words, configuration file 1780 defines how signal data of each attribute type will be displayed to a user. At runtime, in response to a signal having a certain type attribute, user interface 1760 determines that the corresponding captured signal received from embedded logic analyzer 902 should be displayed according to the type attribute defined in configuration file 1780.

For instance, one attribute type may be "analog," depicting an analog signal. Configuration file 1780 may include a definition for presenting signals identified with an analog attribute as an analog waveform. During a test/debug session when a sampled signal is retrieved, user interface 1760 will know that the signals having the analog attribute type will be displayed as analog waveforms.

Further, another signal attribute may be a "name" attribute which is used to generate a new signal or value not appearing in system under test 1710 but nevertheless may be helpful to a user during test or debug. Configuration file 1780 may include a definition for the new signal such that at least one signal tagged with a certain name attribute will allow user interface 1760 to determine the waveform for the new signal based upon its definition in configuration file 1780 and the captured signal corresponding to the tagged signal. Configuration file 1780 may define the new signal using instructions, mapping, mathematical and/or arithmetic formulas or equations or the like, or a combination thereof. In this way, the new signal effectively translates the corresponding captured signal(s) to a form that is easier to read or understand for purposes of system testing or debugging.

For example, in testing and/or debugging a system having a motor encoder signal, the encoder signal may be tagged with a name attribute called a motion attribute and stored in signal database 1730. Configuration file 1780 may define a new signal or value for the motion attribute which computes motor velocity, acceleration or distance traveled by the motor associated with the motor encoder signal. The encoder signal, captured during a test or debug session, may then be used to determine and display the value of the new motion signal (motor velocity, acceleration or distance traveled) based upon the configuration file definition.

It is understood that a new signal derived from a signal tagged with a name attribute may itself be tagged with a type attribute. As a result, the new signal or value may be displayed in a manner as defined in configuration file 1780 for signals of that type.

Yet another signal attribute may be an attribute directed to a particular protocol, such as a communications protocol. A signal may be tagged with a particular protocol attribute, for example, in signal database 1730 or at compilation and/or runtime of a test or debug session. Configuration file 1780 may identify the signals that are required to be captured by logic analyzer 902 during the test/debug session, and specify the various transaction or communication events for each combination of the captured signals. Such transaction events may be visually represented to a user as one or more new signals or values, for example. During a test/debug session, if all of the required captured signals are captured and provided to computing device 1705, user interface 1760 parses the configuration file 1780, determines the transaction event based upon the values of the captured signals and displays the determined transaction event to the user. In this way, the state of a communications protocol may be displayed to a user in a form which is relatively easy for a user to follow.

Still another signal attribute may be an attribute directed to a Boolean logic operation. In particular, a logic attribute may be assigned to a plurality of digital signals associated with logic analyzer 902 appearing in signal database 1730, with such assignment occurring at compilation or runtime of a test or debug session. Configuration file 1780 may identify a Boolean logic operation corresponding to the logic attribute. For example, a logic attribute may be defined in configuration file 1780 as an exclusive OR logic operation operating on a certain number of digital signals, such as two digital signals. During a test or debug session, signals assigned that particular logic attribute are used by user interface 1760 to compute a new signal based upon the Boolean logic operation corresponding to the logic attribute. It is understood that a plurality of different logic attributes may be defined in configuration file 1780 for generating new signals during a test or debug session.

It is understood that a signal attribute may be defined by a signal operation other than Boolean logic operations.

Figure 14:
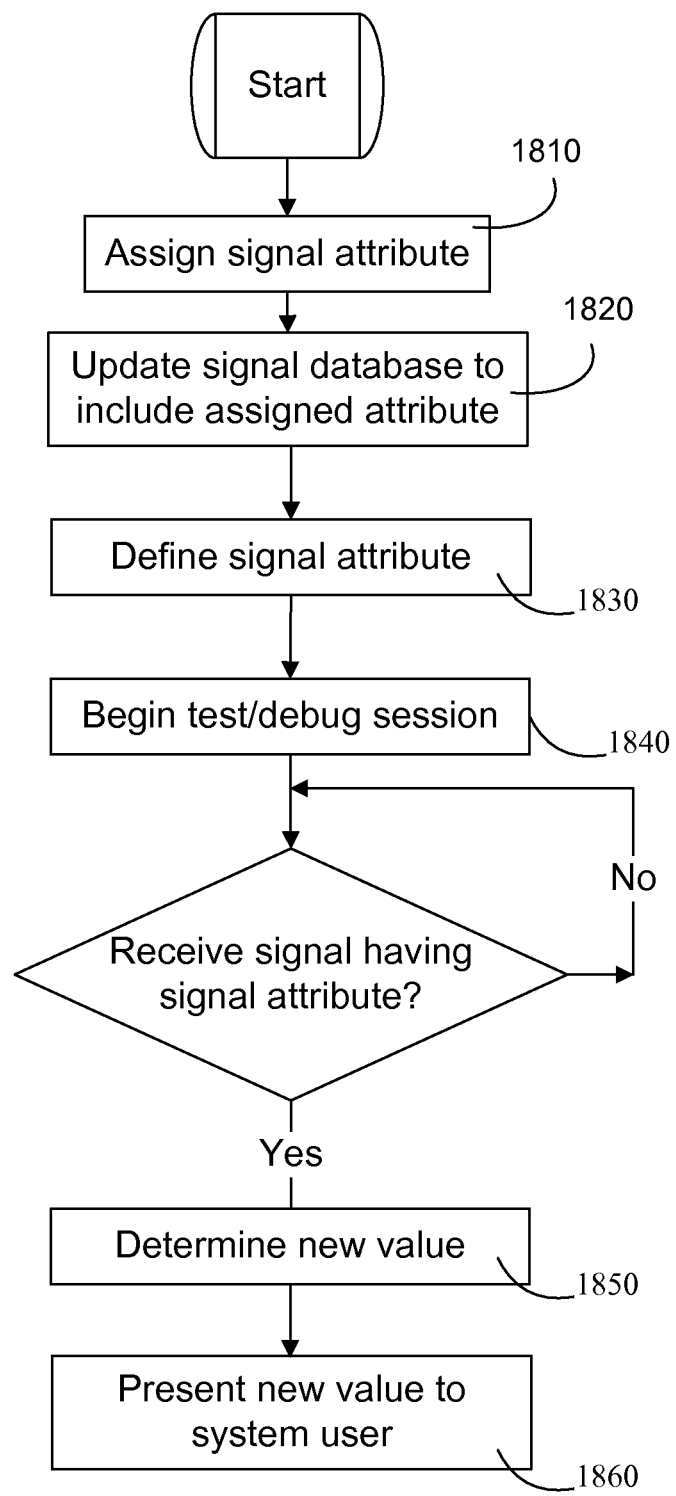
FIG. 14 is a flow chart illustrating the operation of the test system of FIG. 13.

The operation of test system 1700 will be described with reference to FIG. 14 according to an example embodiment. It is understood that the execution of acts of FIG. 14 does not need to follow the exact order described and can vary therefrom. A signal attribute is assigned to a signal at 1810, which effectively maps a particular signal attribute to a signal associated with logic analyzer 902. The signal attribute assignment may be maintained in signal database 1730 at 1820. At 1830, the assigned signal attribute is defined in configuration file 1780, which may define a new signal or value associated with the attribute using a mathematical or arithmetic equation or formula, a Boolean equation, text instructions or the like. Following commencement of a test or debug session at 1840 and after having received the signal from logic analyzer 902 that was tagged with the signal attribute at 1810, the new signal or value is determined at 1850 based upon its definition in configuration file 1780 and the received signal. Thereafter, the new value may be presented to the system user at 1860

As mentioned above, it is desirable to provide more signals than provided by conventional bus bandwidths. A method is discussed herein for reducing the number of routed input signals to ELA 902 without compromising the amount of information available to thereto. This technique takes advantage of time-division multiplexing (TDM) multiple signals across the same bus. An ELA conventionally includes an input multiplexer to which candidate signals are routed, wherein a group of input signals selected by the input multiplexer is available for sampling and/or triggering an event. This input signal group selection is typically made before a test program is executed and remains static for the duration of a corresponding test or debug session. In order to provide more captured signals for a test or debug program, multiple input signal groups of signals can be time division multiplexed over the same bus. By changing the multiplexer selection signals dynamically during the program and capturing the selection signals along with the selected signals, test/debug software executed on a host computing device can reconstruct the captured multiplexed input signals for presentation to a user without the user needing to know the particulars of the input signal group selection by the input multiplexer.

In accordance with an example embodiment, the above-described input signal group selection can change whenever one of the input signal groups change its value. If the input signal groups never change values at the same time, then substantially lossless data capture can be obtained. If multiple input signal groups do change at the same time, the group selection can change one sample later to provide a lossy capture but no more than one timeslice of data loss will occur.

The input signal group selection can change because of the test/debug software or macro created by the user (i.e. the user specifies the conditions that change the input signal group selection). Alternatively, to hide this level of detail from the user, the input signal group selection can change because the software compiler automatically inserts when and how to change the input signal group selection based upon knowledge of the user's program, the device under test, the ELA and any interface circuitry. For example, the user may select 62 signals that are "tagged" in a device under test with an attribute that they change very slowly. These 62 signals may be time division multiplexed over a 32-bit bus. The compiler then automatically inserts an input signal group selection change whenever a corresponding signal in an input signal group changes. Since the captured signals are low-frequency, the amount of "loss" incurred if multiple input signal groups change at the same time is small and oftentimes irrelevant. On the other hand, if the captured signals were tagged with a high-frequency attribute, then the compiler could inform the user that the number of high-frequency signals captured within this program is limited to 32 as the amount of "loss" if input signal groups change at the same time is relatively high.

Figure 15:
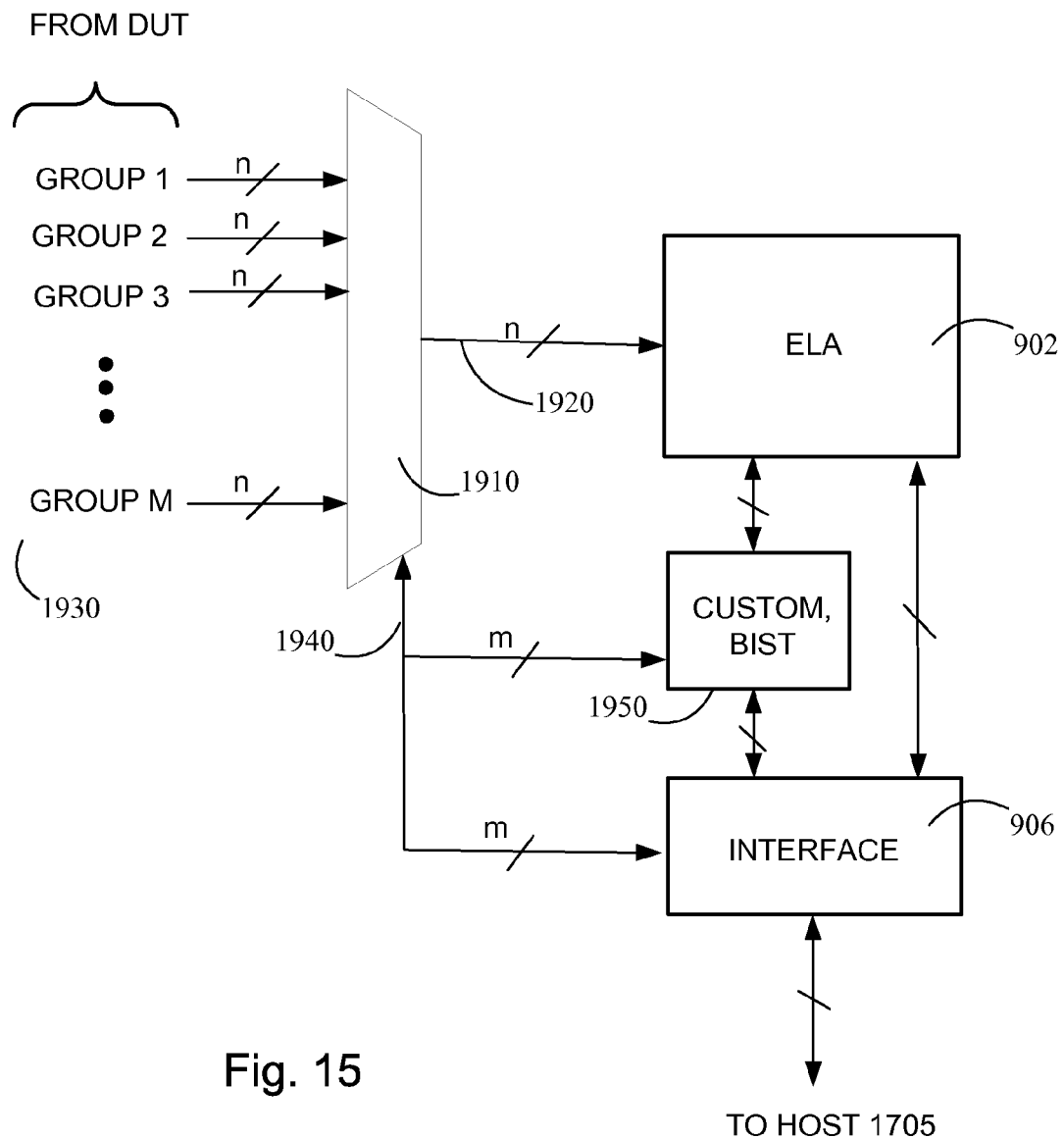
FIG. 15 is a block diagram showing circuitry associated with an embedded logic analyzer according to an example embodiment.

FIG. 15 illustrates a portion of a system or design under test according to an example embodiment. Shown is ELA 902, custom and/or BIST block 1950, interface block 906 and multiplexer circuitry 1910. For purposes of the present example embodiment, customer/BIST block 1950 may include custom circuitry and/or BIST circuitry as described hereinabove with respect to other example embodiments. For example, custom/BIST block 1950 may include one or more of custom blocks 904, 920, 1420 and 1420', and/or one or more BIST blocks 1020 and 1020'. Coupled to the data inputs of multiplexer circuitry 1910 are M groups of input signals 1930 from the device under test. Selection bits 1940 may be generated by custom/BIST block 1950, interface block 906 or other test circuitry.

With continued reference to FIG. 15, "M" represents the number of input signal groups desired to be captured. However, only an n-bit bus 1920 is practical to route to ELA 902, so multiplexer circuitry 1910 is utilized in association with ELA 902. As a result, M groups of n-bit wide input signals 1930 are available to ELA 902 via multiplexer circuitry 1910. The output of multiplexer circuitry 1910 is an n-bit bus 1920 that is coupled to an input of ELA 902. During a test or debug session, n-bit bus 1920 is cycled through the n-bit groups 1930 substantially continuously. This means that the value of one group of n-bit input signals 1930 will not be available when another group of n-bit input signals 1930 are being addressed on the n-bit bus 1920. One or more signals could be available in multiple n-bit input signal groups 1930 or even all such groups. Therefore, a signal from the device under test that is desired to be seen all of the time with no windows of visibility lost due to the time division multiplexing could be a part of all n-bit groups 1930 and thus continuously available to ELA 902.

In order to reduce complexity, the signals that are inputs to multiplexer 1910 for availability on TDM bus 1920 can be abstracted from the user. According to an example embodiment, user interface 1760 can obtain knowledge of the input signals that are subject to time division multiplexing on TDM bus 1920 through means such as a configuration file 1780 that can be stored locally on the host 1705 or that can be retrieved from the device under test containing ELA 902. Once it is known that the input signal groups 1930 are subject to time division multiplexing and available for selection on TDM bus 1920, the individual signals forming input signal groups 1930 can be broken apart from each other and individually displayed to the user via user interface 1760. When a user is creating a program for use in a test or debug session, the user can address the individual input signals forming input signal groups 1930 and the compiler for the program, by use of the obtained signal information in configuration file 1780 and/or signal database 1730, substantially automatically translates the addressed individual input signals to the available visual interface 1706 of host computing device 1705 physically connected to ELA 902.

Consider the following example. With continued reference to FIG. 15, assume there are six groups of input signals 1930 (M=6), with each input signal group 1930 containing four signals (n=4). Therefore, TDM bus 1920 is a four bit bus and there are three selection bits 1940 for selecting one group of input signals 1930 to appear on TDM bus 1920. A total of 24 signals (six groups of 4-bit input signals 1930) are time division multiplexed across input multiplexer 1910. In this example, assume the user wants a trigger event to occur when Group1 is at value "11". Accordingly, the user enters the following into the user interface 1706 in a test program or macro:

IF Group1=11, then TriggerAll( );

The compiler in host 1705 then automatically translates the user's entry using the signal information pertaining to FIG. 15 from signal database 1730. In this case, the compiler translates the user information to be IF (TDM bus 1920=11 and MUX selection bits 1940=0), then TriggerAll( );

As can be seen, the signal name changed from the individual signal name, GROUP1, to the actual signals connected to the ELA 902, Custom/BIST block 1950, and/or interface 906. In particular, the compiler in host 1705 uses selection bits 1940 to address the desired timeslice of the TDM bus 1920. Performing this automatically in software when the program is compiled substantially drastically increases the usability of ELA 902.

Figure 16:
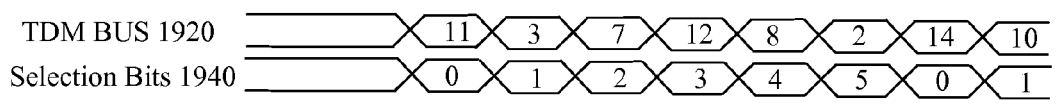
FIG. 16 is a depiction of signal waveforms showing signals associated with the embedded logic analyzer of FIG. 15.
Figure 17:
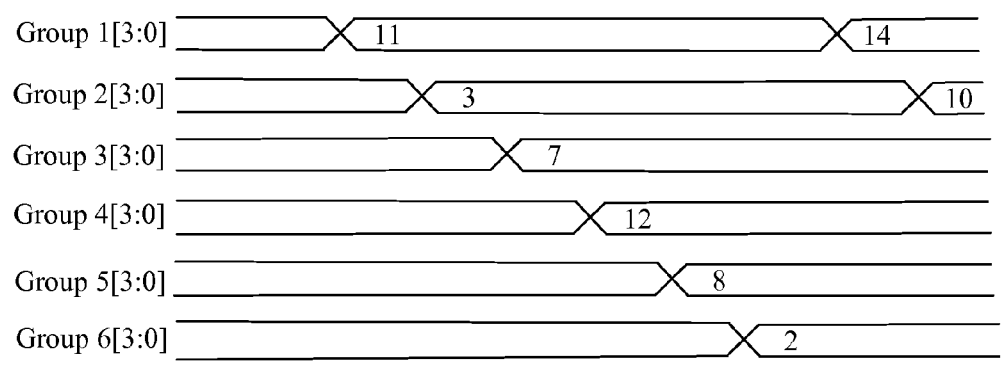
FIG. 17 is a depiction of signal waveforms translated from the signal waveforms of FIG. 16 and presented to a user.

During a subsequent test or debug session, then, the captured signals appear as in FIG. 16. These signals are translated automatically by the software using the obtained knowledge of the device under test, ELA 902, multiplexer circuitry 1910, and/or interface 906 (via signal database 1730 and/or configuration file 1780, for example) and visually presented to the user using user interface 1760 as shown in FIG. 17. By presenting to the user the individual input signals instead of the values captured on TDM bus 1920, it becomes unnecessary for the user to be familiar with how the multiplexing circuitry associated with ELA 902 physically combines its input signals. This level of abstraction is beneficial to the usability of ELA 902.

This technique can be applied to signals that cross different clock domains, such as from a higher frequency clock domain to the clock frequency domain of ELA 902, and especially if such higher frequency clock domain is a multiple of the clock frequency domain of ELA 902. Instead of reducing the number of signals sent to ELA 902, multiple versions of the same signal, each version corresponding to a different time slice of the higher frequency clock domain, is provided to ELA 902. The software compiler of host computing device 1705, using signal database 1730 and/or configuration file 1780, can then abstract this clocked signal arrangement to determine the signal and present same to the user using user interface 1760.

Figure 18:
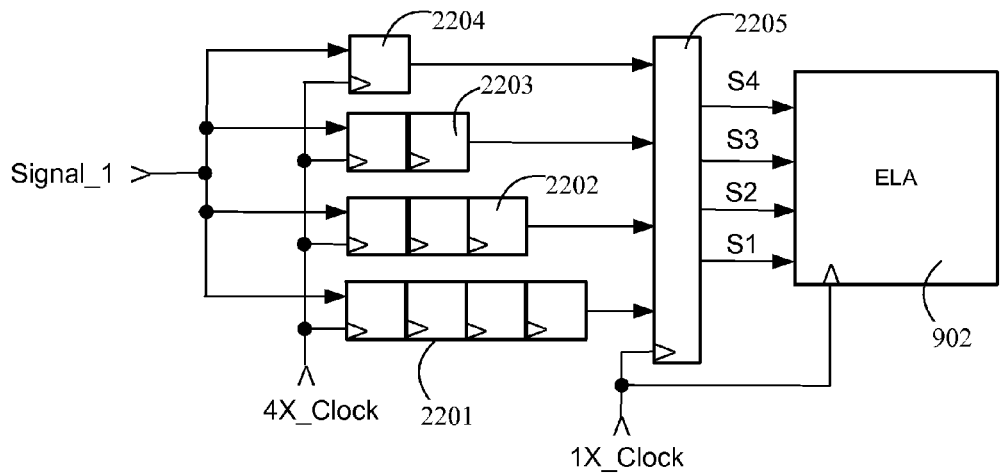
FIG. 18 is a block diagram showing circuitry associated with an embedded logic analyzer according to another example embodiment.

For example, FIG. 18 illustrates a clock domain architecture for which signal abstraction is performed in accordance with an example embodiment. An input signal, Signal_1, is associated with a clock domain corresponding to clock signal 4x_Clock and is to be captured by ELA 902 in a clock domain corresponding to clock signal 1x_Clock. In this example embodiment, the frequency of clock signal 4x_Clock is four times the frequency of clock signal 1x_Clock. A set of registers 2201-2204, each of which is controlled by clock signal 4x_Clock, captures signal Signal_1 on the triggering edge of clock signal 4x_Clock so that the value of Signal_1 is maintained for each timeslice of clock signal 4x_Clock. Register 2205 stores the output of registers 2201-2204 on each triggering edge of clock signal 1x_Clock. Signals S1-S4, corresponding to the output of register 2205, is provided to ELA 902. In the example embodiment, ELA 902 operates off of clock signal 1x_Clock.

Figure 19:
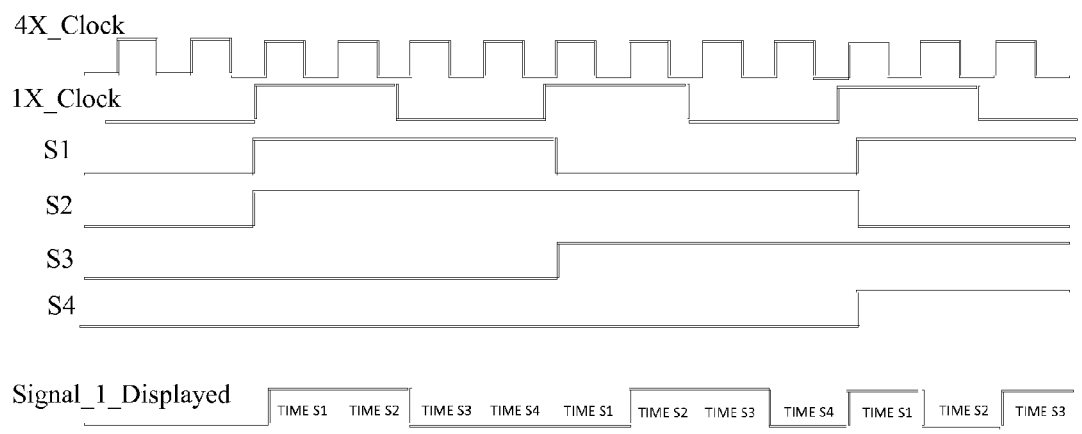
FIG. 19 is a depiction of signal waveforms associated with the embedded logic analyzer of FIG. 18.

If the user, for example, wishes to trigger data capture when Signal_1 is asserted, the following is entered into the test or debug program:

IF (Signal_1=1) THEN TriggerAll( );

When the test/debug program is compiled by the compiler of host computing device 1705, the compiler automatically translates the above command to IF (*S*1=1 or *S*2=1 or *S*3=1 or *S*4=1), THEN TriggerAll( );

During a subsequent test or debug session, then, the signals captured by ELA 902 appear as in FIG. 19. In addition, signal Signal_1_Displayed, which is Signal_1 that has been translated automatically by the software of host computing device 1705 using the obtained knowledge of the signal interface (via signal database 1730 and configuration file 1780, for example) and reconstructed using the signals captured by ELA 902, is then presented to the user as shown in FIG. 19. By showing the individual input signal Signal_1_Displayed instead of signals S1-S4 provided to and captured by ELA 902, user knowledge of the particular clock domain translation circuitry utilized (i.e., registers 2201-2205) is unnecessary. Accordingly, the level of abstraction in recreating and visually presenting signals Signal_1 as shown in FIG. 19 is beneficial to the effective usability of ELA 902.

A benefit of the this signal abstraction performed by the software of host device 1705 is that it combines both actions of 1) taking the user's intent with respect to the operation of ELA 902 and translating that intent into the necessary internal signals associated therewith, and 2) receiving the sampled internal signals associated with ELA 902 and reconstituting the data to represent the signals the user had intended to observe.

Figure 20:
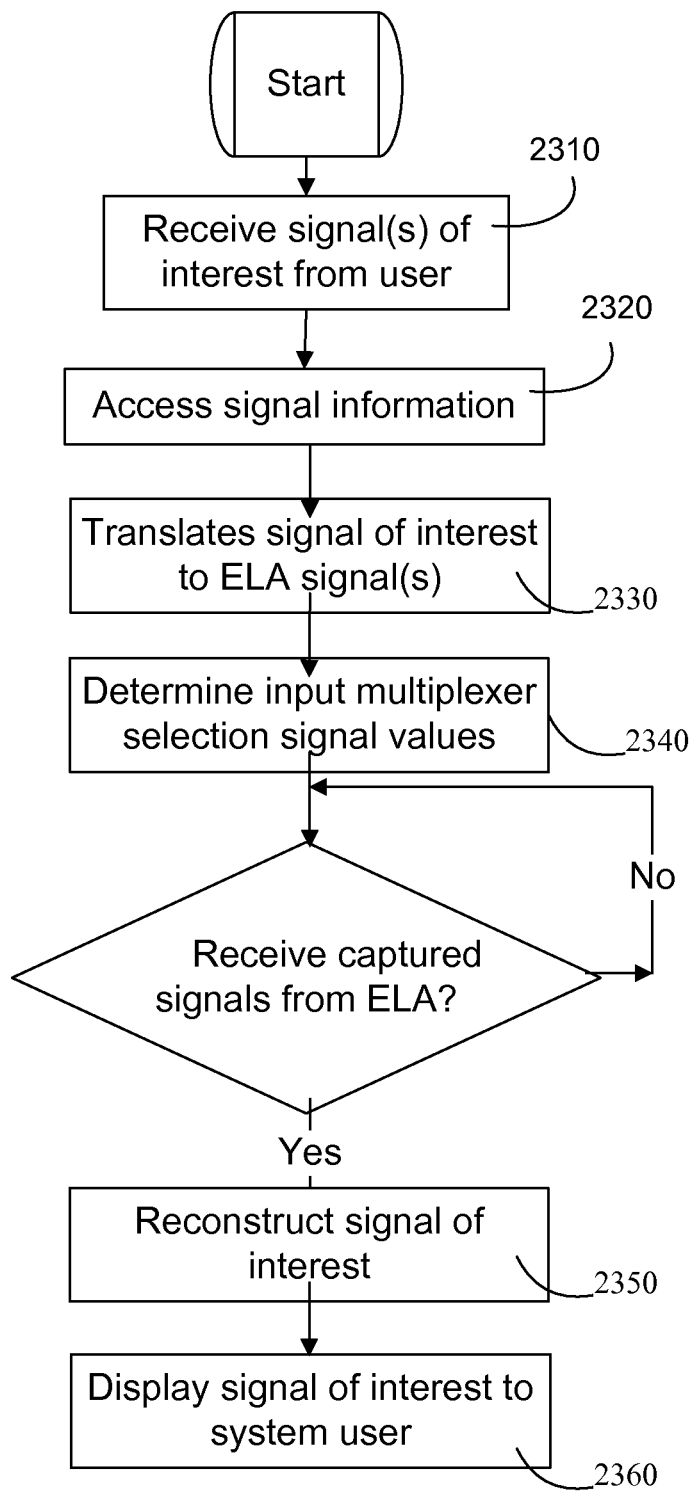
FIG. 20 is a flow chart depicting the operation of a system for testing a device under test having an embedded logic analyzer.

The operation of test and debug system 1700 will be described with respect to FIG. 20. System 1700 receives from a user at least one signal of interest in the design under test during an upcoming test or debug operation at 2310. The signal of interest may be provided to system 1700 in a test program written by the user. During compilation of the test program, the signal of interest, which in the embodiment of FIG. 15 may be a signal in a Group input signal 1930 to input multiplexer 1910, is translated at 2330 into at least one signal provided to and/or associated with ELA 902. This translation is performed in part by system 1700 accessing at 2320 information about the design under test, including ELA 902, input multiplexer 1910, and interface circuitry 906. With knowledge of the design under test, system 1700 is further able to control the selection signals 1940 at 2340 to select the appropriate Group of input signals 1930 during the test or debug operation so as to at least be able to suitably capture the signal of interest. When signals captured by ELA 902 during the test or debug operation are provided to system 1700, system 1700 reconstructs the signal of interest at 2350 based upon the captured signals and knowledge of the design under test. The reconstructed signal of interest is then displayed as an individual signal to the user at 2360.

It will be apparent to those skilled in the art that various modifications and variations can be made to the present disclosure without departing from the spirit and scope of the disclosure. For example, it is understood that the embedded logic analyzer 902 may include an output module 230 and controller 270 found in embedded logic analyzer 200 of FIG. 2. In addition or in the alternative, integrated circuit 900, 910 and 940 may include a CPU and storage medium coupled to inputs of embedded logic analyzer 902. Integrated circuits 900, 910 and 940 may also include a processor coupled to trigger module 220. Thus it is intended that the exemplary embodiments cover the modifications and variations of this invention provided they come within the scope of the appended claims and their equivalents.

The invention claimed is:

1. A method for testing a device under test having an embedded logic analyzer and input circuitry, one or more outputs of the input circuitry being coupled to one or more inputs of the embedded logic analyzer, the method comprising:

receiving an identification of at least one signal appearing in the device under test and provided to the input circuitry, for display during a test or debug session of the device under test;

translating the identified at least one signal into one or more signals associated with the embedded logic analyzer based at least in part upon information relating to the device under test, the embedded logic analyzer and the input circuitry, the one or more signals being different from the at least one signal appearing in the device under test;

receiving, by a computing device, samples of the one or more signals from the embedded logic analyzer, the embedded logic analyzer sampling the one or more signals during the test or debug session;

reconstructing, by the computing device, the identified at least one signal based upon the sampled one or more signals received from the embedded logic analyzer; and displaying the reconstructed at least one signal to the user.

2. The method of claim 1, further comprising determining signal values for controlling the input circuitry and the embedded logic analyzer to sample the one or more signals thereof during the test or debug session based in part upon the identification of the at least one signal, the device under test, the input circuitry and the embedded logic analyzer.

3. The method of claim 2, wherein the input circuitry comprises multiplexer circuitry, the identified at least one signal is an input to the multiplexer circuitry, the sampled one or more signals comprises an output of the multiplexer circuitry, and the signal values for controlling the input circuitry and the embedded logic analyzer comprise signal values for selection signals of the multiplexer circuitry.

4. The method of claim 3, wherein the signal values for the selection signals of the multiplexer circuitry dynamically change state during the test or debug session.

5. The method of claim 1, wherein reconstructing the identified at least one signal is based upon the information pertaining to the device under test, the embedded logic analyzer and the input circuitry.

6. The method of claim 1, wherein one or more of the receiving the identification, translating and displaying are performed by the computing device.

7. The method of claim 1, wherein the input circuitry comprises circuitry which captures the identified at least one signal in a first clock domain and in a second clock domain corresponding to a time domain of the embedded logic analyzer, the first time domain corresponding to a higher frequency than a frequency of the second time domain, wherein the identified at least one signal is reconstructed based upon a first signal defining the higher frequency of the first time domain and a second signal defining the frequency of the second time domain.

8. A software program product stored in non-transitory memory for testing a device under test having an embedded logic analyzer, the software program product having instructions which, when executed by a computing device associated with the device under test cause the computing device to reconstruct signals of interest in the device under test based at least in part upon signals captured by the embedded logic analyzer during a test or debug session, the signals captured being different from the signals of interest in the device under test, and cause the computing device to display the reconstructed signals of interest to a user of the computing device.

9. The software program product of claim 8, wherein the signals of interest form only a portion of the signals provided to the embedded logic analyzer, and the reconstructed signals of interest are displayed as signals separate from other of the signals provided to and captured by the embedded logic analyzer.

10. The software program product of claim 8, wherein the device under test includes multiplexer circuitry having an output coupled to an input of the embedded logic analyzer, the signals of interest are provided to the multiplexer circuitry, and reconstructing the signals of interest is based upon selection control signals of the multiplexer circuitry during the test or debug session.

11. The software program product of claim 10, further comprising instructions for determining signal values of the selection control signals of the multiplexer circuitry based upon signal value transitions of inputs thereto.

12. The software product of claim 10, wherein the selection control signals of the multiplexer circuitry dynamically change state during the test and debug session.

13. The software program product of claim 8, wherein the device under test includes circuitry clocked by a first clock signal and circuitry clocked by a second clock signal, the embedded logic analyzer being clocked by the second clock signal, and reconstructing the signals of interest is based upon the first and second clock signals.

14. The software program product of claim 8, wherein the device under test includes circuitry which captures the signals of interest in a first time domain and in a second time domain, the second time domain corresponding to a time domain of the embedded logic analyzer, the first time domain corresponding to a higher frequency than a frequency of the second time domain, and wherein the signals of interest are reconstructed based upon a first signal defining the higher frequency of the first time domain and a second signal defining the frequency of the second time domain.

15. The software program product of claim 8, further including instructions for accessing information relating to the device under test and the embedded logic analyzer therein for use in reconstructing the signals of interest.

16. The software program product of claim 8, further including instructions for determining signal values for controlling the embedded logic analyzer during the test or debug session based upon information relating to the device under test and the embedded logic analyzer and upon the signals of interest.

17. The software program product of claim 8, further comprising instructions for receiving the signals of interest from the user and translating the received signals of interest into the signals to be captured by the embedded logic analyzer during the test and debug session.

18. The software program product of claim 17, further comprising instructions for accessing information relating to the device under test and the embedded logic analyzer therein for use in translating the signals of interest into the signals to be captured by the embedded logic analyzer during the test and debug session.

19. The software program product of claim 8, wherein reconstructing the signals of interest is based upon selection control signals used in selecting the signals provided to the embedded logic analyzer.

20. A method for testing a device under test having an embedded logic analyzer and input circuitry, one or more outputs of the input circuitry being coupled to one or more inputs of the embedded logic analyzer, the method comprising:

receiving an identification of at least one signal in the device under test provided to the input circuitry, for display during a test or debug session of the device under test;

translating the identified at least one signal into one or more signals associated with the embedded logic analyzer based at least in part upon information relating to the device under test, the embedded logic analyzer and the input circuitry;

receiving, by a computing device, samples of the one or more signals from the embedded logic analyzer, the embedded logic analyzer sampling the one or more signals during the test or debug session;

reconstructing, by the computing device, the identified at least one signal based upon the sampled one or more signals received from the embedded logic analyzer; and displaying the reconstructed at least one signal to the user;

wherein the input circuitry comprises circuitry which captures the identified at least one signal in a first clock domain and in a second clock domain corresponding to a time domain of the embedded logic analyzer, the first time domain corresponding to a higher frequency than a frequency of the second time domain, wherein the identified at least one signal is reconstructed based upon a first signal defining the higher frequency of the first time domain and a second signal defining the frequency of the second time domain.

* * * * *